United States Patent [19]
Kagami

[11] Patent Number: 5,394,369
[45] Date of Patent: Feb. 28, 1995

[54] SEMICONDUCTOR MEMORY DEVICE INCORPORATING REDUNDANCY MEMORY CELLS HAVING PARALLEL TEST FUNCTION

[75] Inventor: Akihiko Kagami, Tokyo, Japan

[73] Assignee: NEC Corporation, Tokyo, Japan

[21] Appl. No.: 10,194

[22] Filed: Jan. 28, 1993

[30] Foreign Application Priority Data

Jan. 30, 1992 [JP] Japan .................... 4-040329

[51] Int. Cl.⁶ .................................. G11C 13/00
[52] U.S. Cl. .................... 365/200; 365/201; 365/230.03; 365/230.06
[58] Field of Search ............ 365/200, 201, 230.03, 365/230.06; 371/21.1

[56] References Cited

U.S. PATENT DOCUMENTS 4,908,798 3/1990 Urai .................... 365/200 X
5,148,398 9/1992 Kohno .................. 365/201

*Primary Examiner*—Do Hyun Yoo
*Attorney, Agent, or Firm*—Sughrue, Mion, Zinn, Macpeak & Seas

[57] ABSTRACT

In a semiconductor memory device which can perform a parallel test upon a predetermined number of memory cells by using a degenerate address of a plurality of first addresses each corresponding to one memory cell, when a defective memory cell is found by a parallel test using the degenerate address, an address whose space includes the space of the degenerate address is written into only one location of its corresponding redundancy decoder to replace the defective memory cell with its corresponding redundancy memory cell.

2 Claims, 19 Drawing Sheets

SEMICONDUCTOR MEMORY DEVICE INCORPORATING REDUNDANCY MEMORY CELLS HAVING PARALLEL TEST FUNCTION

BACKGROUND OF THE INVENTION

1. Field of the Invention

The present invention relates to a semiconductor memory device incorporating redundancy memory cells having a parallel test function, and more particularly, an improvement of a redundancy decoder portion thereof.

2. Description of the Related Art

In a prior art semiconductor memory device incorporating redundancy memory cells, one redundancy decoder is provided in the periphery of each normal decoder for activating memory cells of a memory cell block. In other words, the number of redundancy decoders is the same as that of normal decoders. Therefore, if a defective memory cell is found in one memory cell block, an address of a defective memory cell is written into the corresponding redundancy decoder of the same memory cell block by laser trimming or the like. As a result, when such a defective address is received by the redundancy decoder, the redundancy decoder deactivates its corresponding normal decoder and in its place, selects the redundancy memory cell, to thereby replace the defective memory cell with the redundancy memory cell. Thus, the defective memory cell is alleviated.

On the other hand, as the integration of semiconductor memory devices has developed, a marching test, where "1" (or "0") is sequentially written into all of the memory cells and after that, data is sequentially read therefrom, requires a considerable time such as 10 s in the case of a 4 Mbit dynamic random access memory (DRAM). Therefore, in order to reduce a test time, a parallel test such as the "JEDEC standard" has been adopted. For example, in a 4 Mbit DRAM, "1" (or "0") is simultaneously written into 32 memory cells, and after that, data is simultaneously read therefrom. As a result, if the read data fails to coincide, a common address between the 32 memory cells, i.e., a degenerate address is written into the corresponding redundancy decoders, thereby to replace all the 32 memory cells with their corresponding redundancy memory cells.

In the parallel test for the prior art semiconductor memory device, however, since each of the redundancy decoders is provided for one of the memory cell blocks, the degenerate address is written into each of the redundancy decoders for the memory cell blocks to which the 32 memory cells belong to. That is, if the 32 memory cells belong to four memory cell blocks, the writing operation of the degenerate address is performed upon four locations of the redundancy decoders, in other words, this writing operation is carried out four times, which increases the test time. This will be explained in detail later.

SUMMARY OF THE INVENTION

It is an object of the present invention to reduce a test time of a parallel test for a semiconductor memory device incorporating redundancy memory cells.

According to the present invention, in a semiconductor memory device which can perform a parallel test upon a predetermined number of memory cells by using a degenerate address of a plurality of first addresses each corresponding to one memory cell, when a defective memory cell is found by a parallel test using the degenerate address, an address whose space includes the space of the degenerate address is written into only one location of its corresponding redundancy decoder to replace the defective memory cell with its corresponding redundancy memory cell. Thus, the number of writing operations for a degenerate address can be reduced, to thereby reduce the test time.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of embodiments of the present invention, a prior art semiconductor memory device will be explained with reference to FIG. 1.

Figure 1:
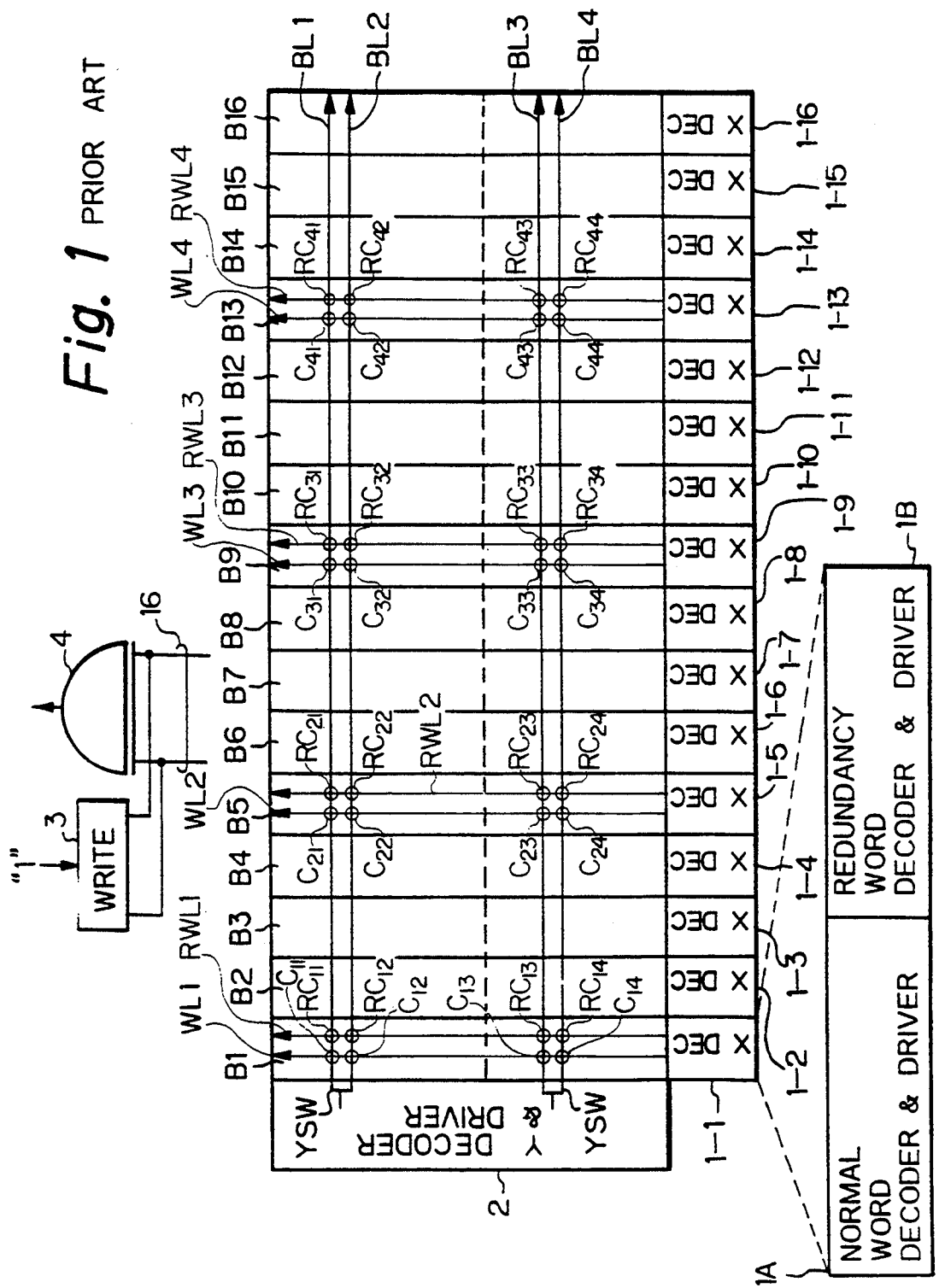
FIG. 1 is a block circuit diagram illustrating a prior art semiconductor memory device incorporating redundancy memory cells.

In FIG. 1, which illustrates a prior art 4 Mbit DRAM on which a parallel test can be carried out, references B1 through B16 designate memory cell blocks, each of which includes 256 kbit memory cells located at intersections between 256 word lines and 1024 bit lines. Note that two bit lines are simultaneously accessed by a Y switch line signal YSW. Also, each of the memory cell blocks B1 through B16 incorporates redundancy memory cells located at intersections between redundancy word lines RWL1, RWL2, RWL3, RWL4 and the bit lines.

X decoders and drivers 1-1 through 1-16 are provided for the memory cell blocks B1 through B16, respectively, and a Y decoder and driver 2 is provided commonly for the memory cell blocks B1 through B16. Each of the X decoders and drivers 1-1 through 1-16 includes a normal word decoder and driver such as 1A for the word lines and a redundancy word decoder and driver such as 1B for the redundancy word lines.

In a normal mode, a plurality of word lines such as 4 word lines WL1, WL2, WL3 and WL4 are selected by the X decoders and drivers 1-1 through 1-16, and a plurality of bit lines such as 4 bit lines BL1, BL2, BL3 and BL4 are selected by two Y switch signals from the Y decoder and driver 2, to thereby access 16 memory cells C11, C12, C13, C14, ..., C41, C42, C43, and C44 and connect them to the 16 I/O lines (not shown). Then, one of the I/O lines is selected by the I/O selecting circuit (not shown), to complete an access of one memory cell.

In a parallel test mode at a wafer stage test, 16 memory cells such as C11, C12, C13, C14, ..., C41, C42, C43 and C44 are also selected by the X decoders and drivers 1-1 through 1-16 and the Y decoder and driver 2, and predetermined data such as "1" is written simultaneously by a parallel write circuit 3 into the selected memory cells C11, C12, C13, C14, ..., C41, C42, C43 and C44. After that, a read operation is performed simultaneously upon the selected memory cells C11, C12, C13, C14, ..., C41, C42, C43 and C44, to supply read data via the 16 I/O lines to a determination circuit such as an exclusive OR circuit 4. In the exclusive OR circuit 4, if at least one of the read data is different from the predetermined write data "1", the exclusive OR circuit 4 generates a "1" signal indicating the existence of a defective memory cell which should be replaced by a redundancy memory cell.

In the above-mentioned state, even when only the memory cell C11 is defective and the other memory cells C12, C13, C14, ..., C41, C42, C43 and C44 are normal, a degenerate address indicating all the word lines WL1, WL2, WL3 and WL4 has to be written into the redundancy word decoders 1B of the X decoders and drivers 1-1, 1-5, 1-9 and 1-13, to thereby replace all the memory cells C11, C12, C13, C14, ..., C41, C42, C43 and C44 with their corresponding redundancy memory cells. In other words, the writing operation of the degenerate address by the laser trimming or the like is repeated four times. Thus, reduction in test time is not expected, even when a parallel test is adopted.

Figure 2:
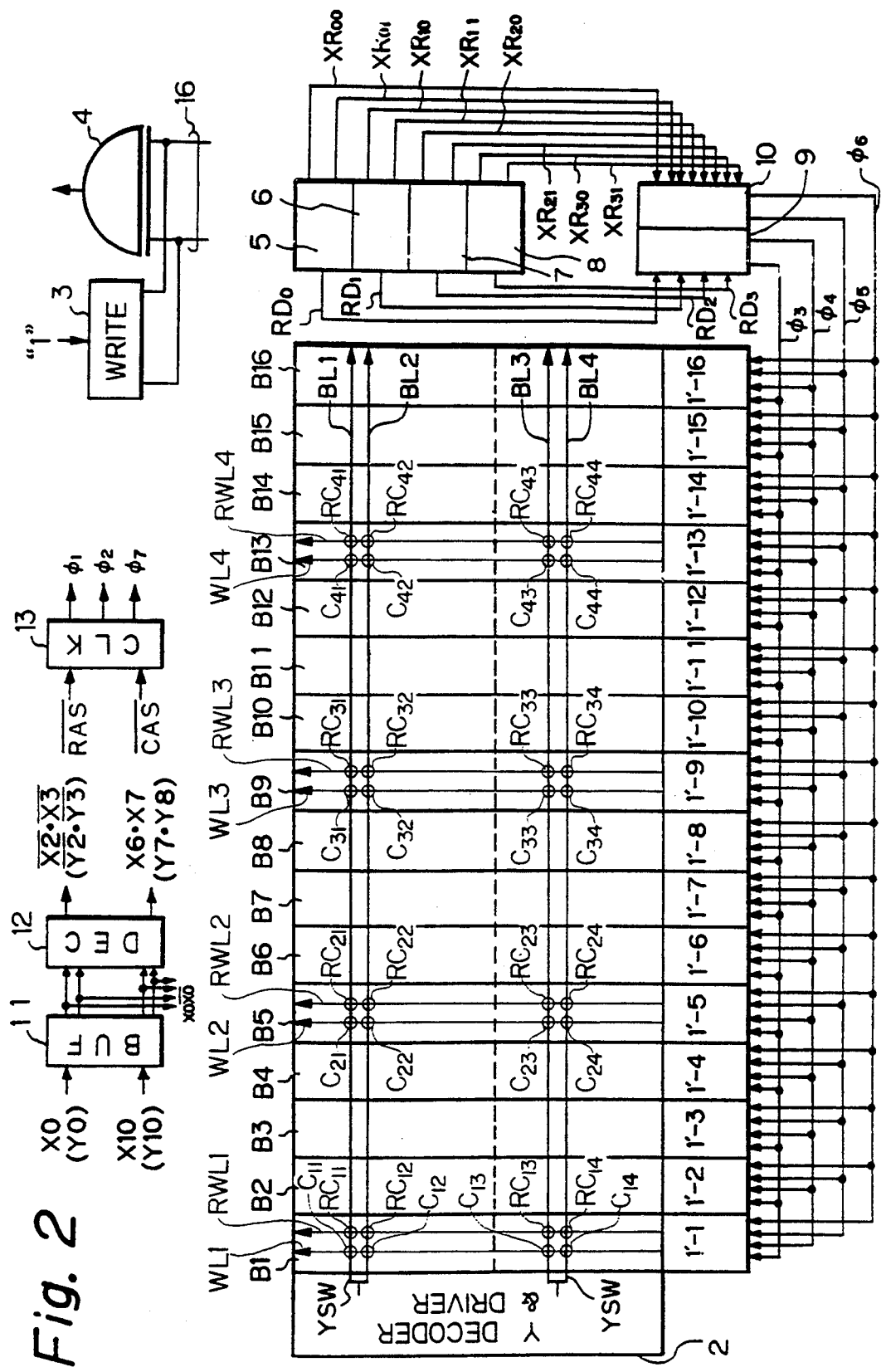
FIG. 2 is a block circuit diagram illustrating a first embodiment of the semiconductor memory device incorporating redundancy memory cells according to the present invention.

In FIG. 2, which illustrates a first embodiment of the present invention, X decoder portions 1'-1 through 1'-16 are provided for the memory cell blocks B1 through B16, respectively, however, the X decoder portions 1'-1 through 1'-16 do not include redundancy word decoders for a degenerate address. Instead of this, a redundancy word decoder 5 is provided for the memory cell blocks B1, B5, B9 and B13; a redundancy word decoder 6 is provided for the memory cell blocks B2, B6, B10 and B15; a redundancy word decoder 7 is provided for the memory cell blocks B3, B7, B11 and B15; and a redundancy word decoder 8 is provided for the memory cell blocks B4, B8, B12 and B16. Also, provided between the redundancy word decoders 5, 6, 7 and 8 and the X decoder portions 1'-1 through 1'-16 are a normal row address activating circuit 9 and a redundancy row address activating circuit 10. In this case, each of the redundancy word decoders 5, 6, 7 and 8 includes two fuse-type programmable read-only memories (PROM's) each. for storing an address including a degenerate address indicating a defective memory cell. That is, when all of the redundancy word decoders 5, 6, 7 and 8 are not activated to make their output signals $RD_0$, $RD_1$, $RD_2$, $RD_3$, $XR_{00}$, $XR_{01}$, ..., $XR_{30}$ and $XR_{31}$ high, the normal row address activating circuit 9 makes one of its output signals $\phi_3$ and $\phi_4$ high and the other low, thereby to activate normal decoding and driving portions of the X decoder portions 1'-1 through 1'-16. Simultaneously, the redundancy row address activating circuit 10 makes its output signals $\phi_5$ and $\phi_6$ high to deactivate redundancy driving portions of the X decoder portions 1'-1 through 1'-16. On the other hand, when one of the redundancy word decoders such as 5 is activated by an address stored in the PROM thereof to make its output signal $RD_0$ low and one of its output signals $XR_{00}$ and $XR_{01}$ low, the normal row address activating circuit 9 makes both of its output signals $\phi_3$ and $\phi_4$ low, to thereby deactivate the normal decoding and driving portions of the X decoder portions 1'-1, 1'-5, 1'-9 and 1'-13. Simultaneously, the redundancy row address activating circuit 10 makes one of its output signals $\phi_5$ and $\phi_6$ low to activate the redundancy driving portions of the X decoder portions 1'-1, 1'-5, 1'-9 and 1'-13, thus replacing the word lines such as WL1, WL2, WL3 and WL4 with their corresponding redundancy word lines $RWL_1$, $RWL_2$, $RWL_3$, $RWL_4$.

Also, in FIG. 2, reference numeral 11 designates an address buffer incorporating a multiplexer for receiving address signals X0 through X10 (Y0 through Y10) to generate signals X0 through X10 and their inverted signals $\overline{X0}$ through $\overline{X10}$ (signals Y0 through Y10 and their inverted signals $\overline{Y0}$ through $\overline{Y10}$). Reference numeral 12 designates a partial decoder for receiving the signals $\overline{X0}$ through $\overline{X10}$ and X0 through X10 to generate various logic signals such as $\overline{X2}.\overline{X3}$, $X2.\overline{X3}$, $\overline{X2}.X3$, $X2.X3$, ..., $\overline{X6}.\overline{X7}$, $X6.\overline{X7}$, $\overline{X6}.X7$, $X6.X7$. Note that the address signals X0, X1, ..., X7 and their inverted signals are used for selecting one word line from the 256 word lines of the memory cell blocks B1 through B16, respectively. Also, the address signals X8 and X9 and their inverted signals are used for selecting one group (i.e., one test group) from four groups of the memory cell blocks. In this case, the first group designated by the signal $\overline{X8}.\overline{X9}$ is formed by the memory cell blocks B1, B5, B9 and B13; the second group designated by the signal $X8.\overline{X9}$ is formed by the memory cell blocks B2, B6, B10 and B14; the third group designated by the signal $\overline{X8}.X9$ is formed by the memory cell blocks B3, B7, B11 and B15; and the fourth group designated by the signal $X8.X9$ is formed by the memory cell blocks B4, B8, B12 and B16. Also, the address signal X10 and its inverted signal are used for selecting one group from two groups of the memory cell blocks. In this case, the first group designated by the signal $\overline{X10}$ is formed by the memory cell blocks B1 through B8, and the second group designated signal X10 is formed by the memory cell blocks B9 through B16. Further, the address signal Y0 and its inverted signal are used for selecting one group from two groups of the memory cell blocks. In this case, the first group designated by the signal $\overline{Y0}$ is formed by the memory cell blocks B1, B2, B3, B4, B9, B10, B11 and B12, and the second group designated by the signal Y0 is formed by the memory cell blocks B5, B6, B7, B8, B13, B14, B15 and B16. The address signal $\overline{Y1}$ and its inverted signal are used for switching the I/O lines (not shown). For example, the memory cell $C_{11}$, $C_{21}$, $C_{31}$, $C_{41}$, $C_{13}$, $C_{23}$, $C_{33}$ and $C_{43}$ are selected by the signal $\overline{Y1}$, and the memory cells $C_{12}$, $C_{22}$, $C_{32}$, $C_{42}$, $C_{14}$, $C_{24}$, $C_{34}$ and $C_{44}$ are selected by the signal Y1. The address signal Y2 and its inverted signal are used for switching parts of the Y decoder portion 2. For example, the memory cells $C_{11}$, $C_{21}$, $C_{31}$, $C_{41}$, $C_{12}$, $C_{22}$, $C_{32}$ and $C_{42}$ are selected by the signals $\overline{Y2}$, and the memory cells $C_{13}$, $C_{23}$, $C_{33}$, $C_{43}$, $C_{14}$, $C_{24}$, $C_{34}$ and $C_{44}$ are selected by the signal Y2. Thus, in a usual mode, one of the sixteen memory cells such as $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$ is accessed by the four address signals X10, Y0, Y1 and Y2 and their inverted signals using the I/O selecting circuit (not shown). Contrary to this, in a parallel test, the signals X10, Y0, Y1 and Y2 can be arbitrarily (or randomly) selected to simultaneously access 16 memory cells such as $C_{11}$, $C_{12}$, $C_{13}$, $C_{14}$, $C_{21}$, $C_{22}$, $C_{23}$, $C_{24}$, $C_{31}$, $C_{32}$, $C_{33}$, $C_{34}$, $C_{41}$, $C_{42}$, $C_{43}$ and $C_{44}$.

Also, in FIG. 2 reference numeral 13 designates a clock signal generator for receiving an inverted signal of a row address strobe (RAS) signal and an inverted signal of a column address strobe (CAS) signal to generate a clock signal $\phi_1$, in synchronization with the signal RAS, a clock signal $\phi_2$ in synchronization with the signal RAS, a write CAS before RAS signal CBR, and the like.

The circuit of FIG. 2 will be explained in detail with reference to FIG. 3A, 3B, 3C, 3D, and 4 through 15.

Figure 3A:
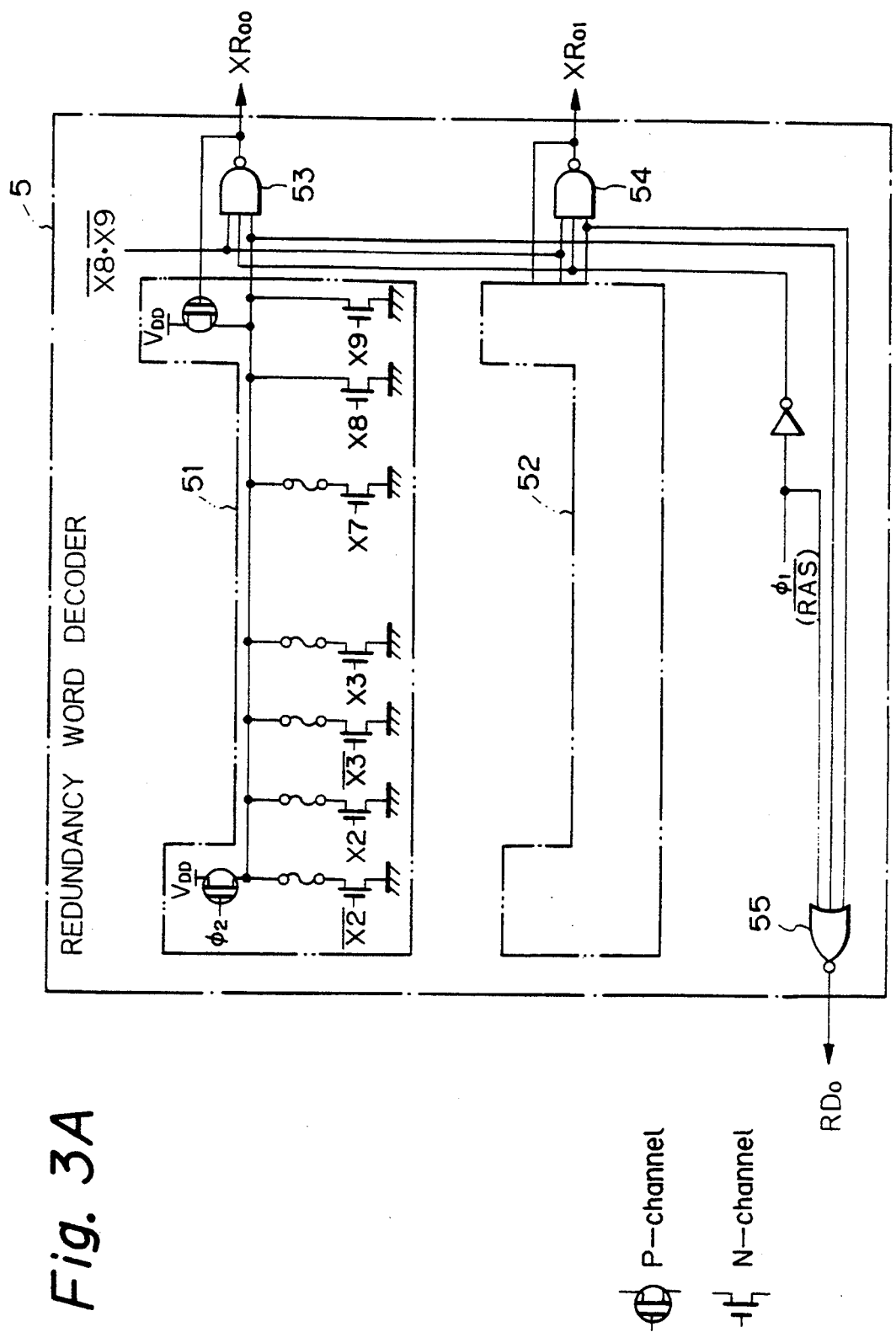
FIG. 3A, 3B, 3C and 3D are detailed circuit diagrams of the redundancy word decoders of FIG. 2.

In FIG. 3A, which is a detailed circuit diagram of the redundancy word decoder 5 of FIG. 2, when at least one of the 16 memory cells such as $C_{11}$, $C_{12}$, ..., $C_{44}$ is determined to be defective in a parallel test, an address defined by X2 through X7 including a degenerate address defined by X0 through X9 commonly for the 16 memory cells, is written into a fuse-type PROM 51 or 52, i.e., the fuses thereof are trimmed by the laser. Outputs of the fuse-type PROM's 51 and 52 are connected to inputs of NAND circuits 53 and 54, respectively, which also receive the signal $\overline{X8.X9}$ and an inverted signal of the clock signal $\phi_1$. Further, the outputs of the fuse-type PROM's 51 and 52 are connected to inputs of a NOR circuit 55 which also receives the clock signal $\phi_1$. Therefore, the fuse-type PROM's 51 and 52 are activated by the clock signal $\phi_2$ (RAS) and after the NAND circuits 53 and 54 are activated by the signal $\overline{X8.X9}$ and the clock signal $\phi_1$ (RAS), the outputs of the fuse-type PROM's 51 and 52 are clamped by feeding back the outputs of the NAND circuits 53 and 54 thereto.

Figure 3B:
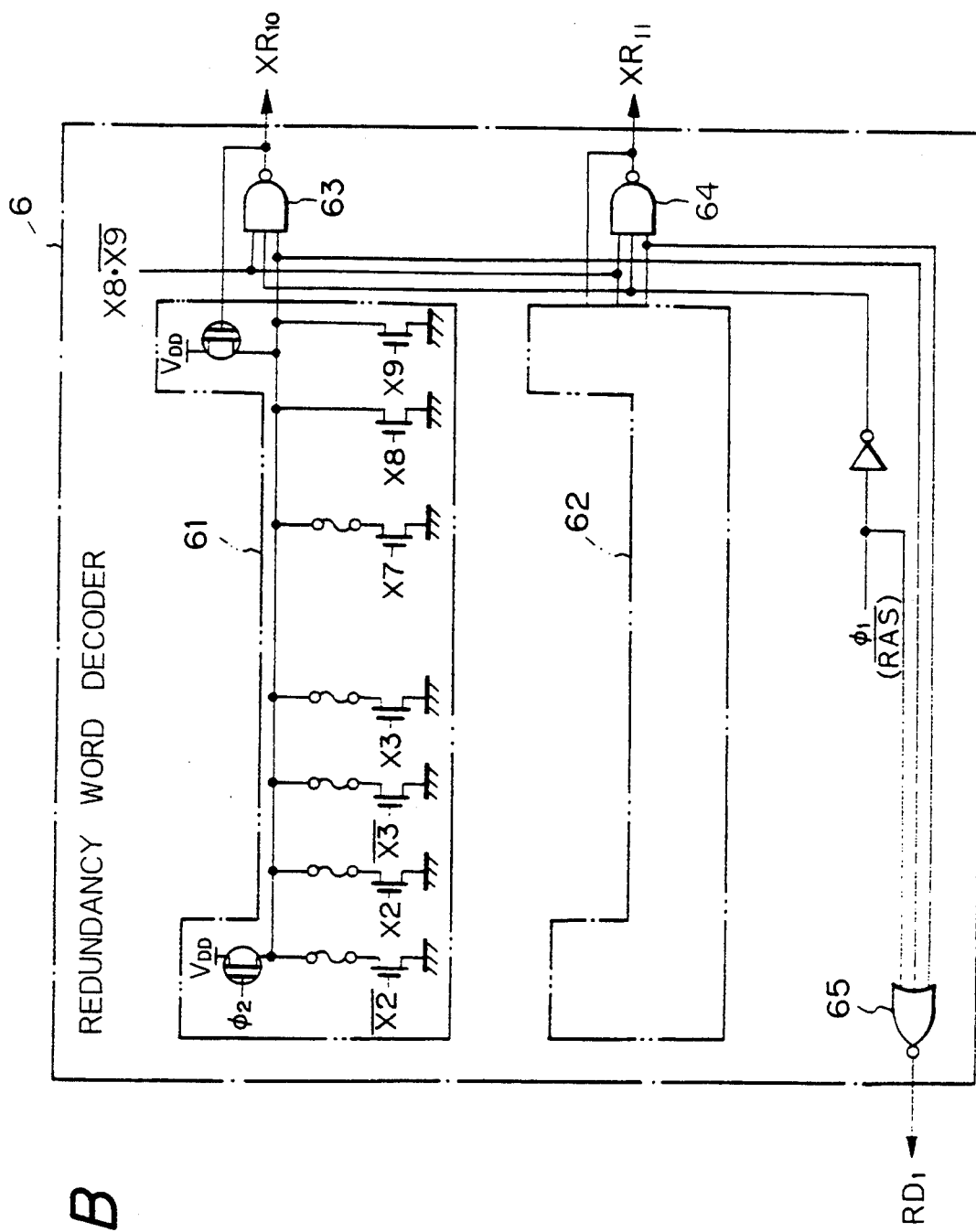
Figure 3C:
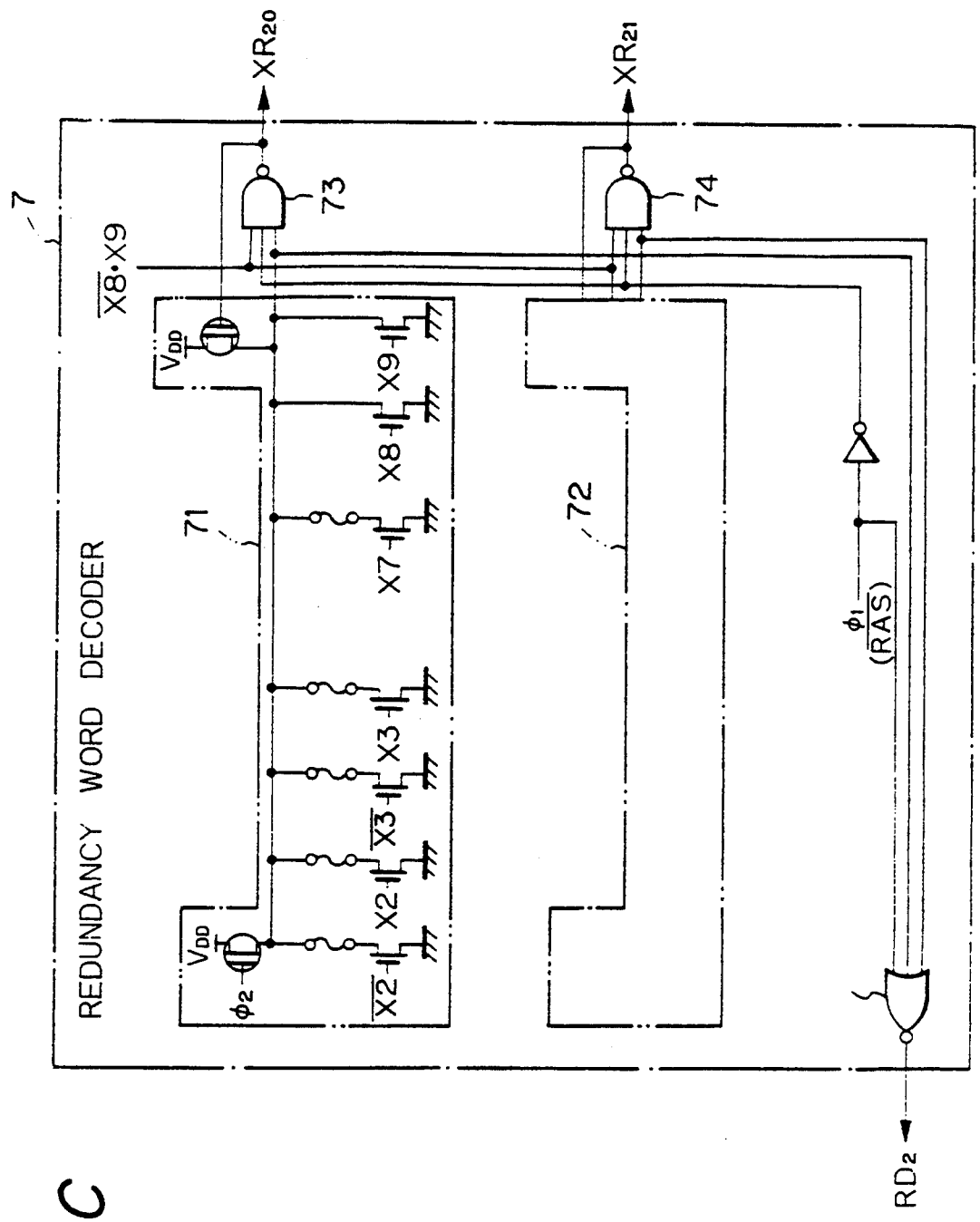
Figure 3D:
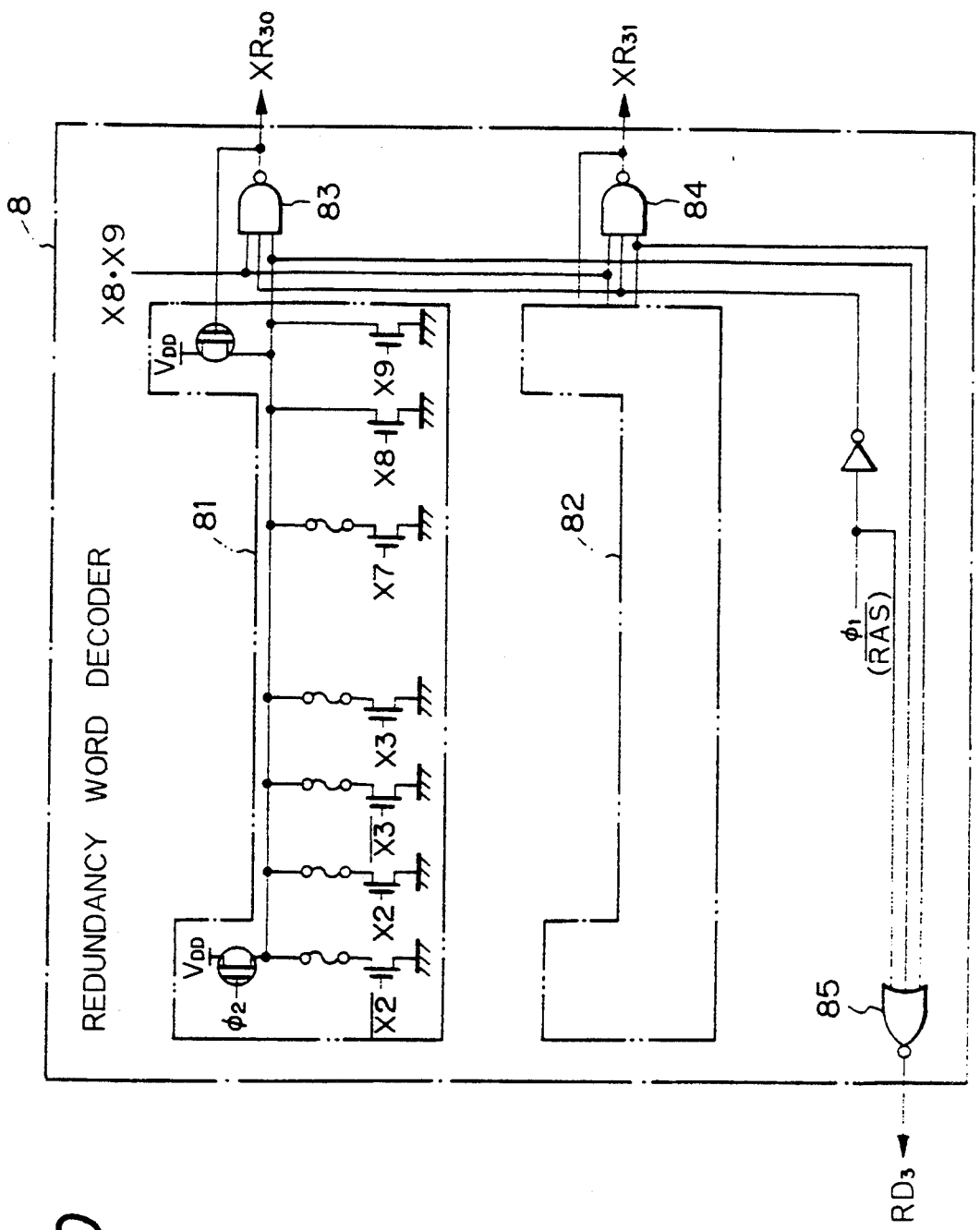

As illustrated in FIGS. 3B, 3C and 3D, the redundancy word decoders 6, 7 and 8 have a configuration similar to the redundancy word decoder 5, but the NAND circuits 63, 64, 73, 74, 83 and 84 of the redundancy word decoders 6, 7 and 8 are activated by the signals $X8.\overline{X9}$, $\overline{X8}.X9$ and $X8.X9$, respectively.

Therefore, when an accessed address defined by the signals X2, X3, ..., and X7 and their inverted signals does not coincide with any of the addresses written into the fuse-type PROM's 51, 52, 61, 62, 71, 72, 81 and 82, all of the outputs thereof are made low, so that all of the outputs $XR_{00}$, $XR_{01}$, $RD_0$, $XR_{10}$, $XR_{11}$, $RD_1$, $XR_{20}$, $XR_{21}$, $RD_2$, $XR_{30}$, $XR_{31}$ and $RD_3$ of the redundancy word decoders 5, 6, 7 and 8 are high. Contrary to this, when such an address including the signals X8 and X9 coincides with one of the addresses written into the fuse-type PROM's such as 51, only the output signals $XR_{00}$ and $RD_0$ are made low and the other output signals remain high.

Figure 4:
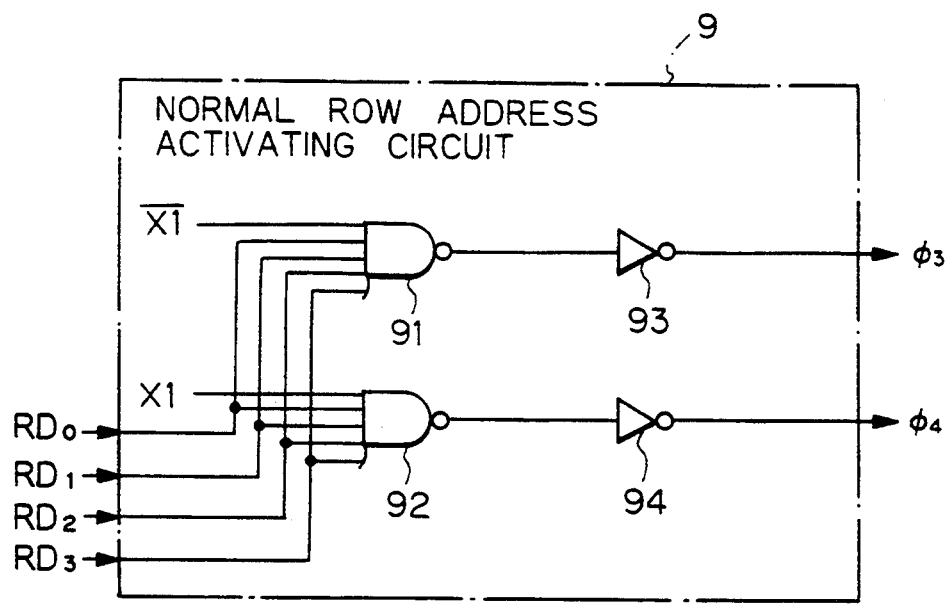
FIG. 4 is a detailed circuit diagram of the normal row address activating circuit of FIG. 2.

In FIG. 4, which is a detailed circuit diagram of the normal row address activating circuit 9 of FIG. 2, the normal row address activating circuit 9 includes two NAND circuits 91 and 92, and two inverters 93 and 94. The NAND circuits 91 and 92 receive the signals $\overline{X1}$ and X1, respectively, and also receive the output signals $RD_0$, $RD_1$, $RD_2$ and $RD_3$ of the redundancy word decoders 5, 6, 7 and 8 in common. When an accessed address defined by the signals X2, X3, ..., and X7 and their inverted signals does not coincide with any of the addresses written in the fuse-type PROM's, all of the signals $RD_0$, $RD_1$, $RD_2$ and $RD_3$ are high, and therefore, the outputs $\phi_3$ and $\phi_4$ of the normal row address activating circuit 9 are logically the same as the signal $\overline{X1}$ and X1, respectively, thus activating the normal decoding and driving portions of the corresponding X decoder portions such as 1'-1, 1'-5, 1'-9 and 1'-13. Contrary to this, when an accessed address including the signals X8 and X9 coincides with one of the addresses written into the fuse-type PROM's, one of the signals $RD_0$, $RD_1$, $RD_2$ and $RD_3$ is made low to disable the NAND circuits 91 and 92, i.e., deactivate the signals $\phi_3$ and $\phi_4$, thus deactivating the normal decoding and driving portions of all of the corresponding X decoder portions 1'-1 through 1'-16.

Figure 5:
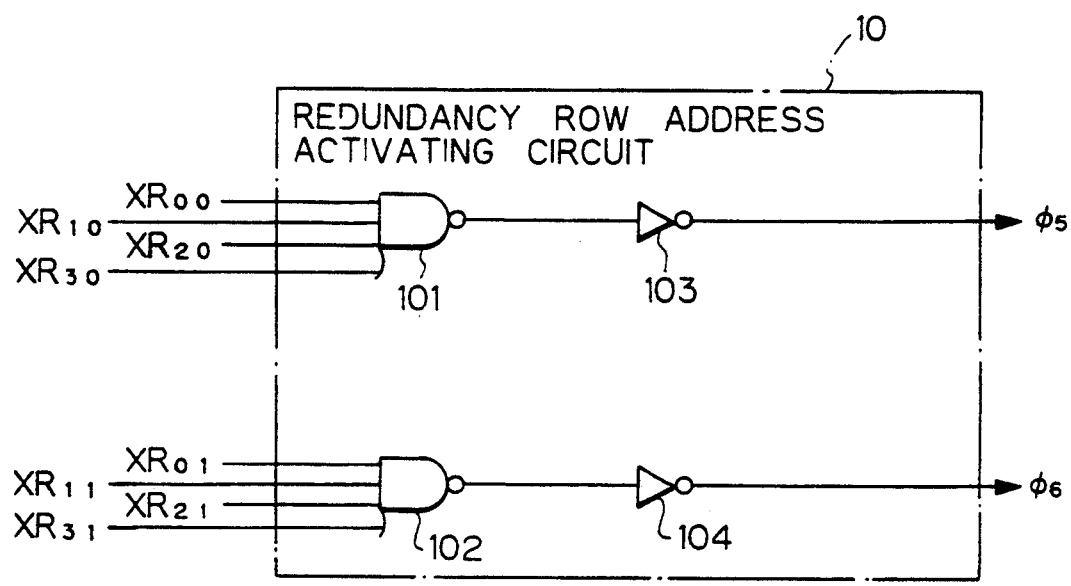
FIG. 5 is a detailed circuit diagram of the redundancy row address activating circuit of FIG. 2.

In FIG. 5, which is a detailed circuit diagram of the redundancy row address activating circuit 10 of FIG. 2, the redundancy row address activating circuit 10 includes two NAND circuits 101 and 102, and two inverters 103 and 104. The NAND circuit 101 receives the output signals $XR_{00}$, $XR_{10}$, $XR_{20}$ and $XR_{30}$ of the redundancy word decoders 5, 6, 7 and 8, and the NAND circuit 102 receives the output signals $XR_{01}$, $XR_{11}$, $XR_{21}$ and $XR_{31}$ of the redundancy word decoders 5, 6, 7 and 8. Therefore, when an accessed address defined by the signals X2, X3, ..., and X7 and their inverted signals does not coincide with any of the addresses written in the fuse-type PROM's, all of the signals $XR_{00}$, $XR_{10}$, $XR_{20}$, $XR_{30}$, $XR_{01}$, $XR_{11}$, $XR_{21}$ and $XR_{31}$ are high, and therefore, the outputs $\phi_5$ and $\phi_6$ of the redundancy row address activating circuit 10 are high, thus deactivating the redundancy driving portions of the corresponding X decoder portions 1'-1 through 1'-16. Contrary to this, when an accessed address including the signals X8 and X9 coincides with one of the addresses written into the fuse-type PROM's, one of the signals $XR_{00}$, $XR_{10}$, $XR_{20}$, $XR_{30}$, $XR_{01}$, $XR_{11}$, $XR_{21}$ and $XR_{31}$ is made low to disable one of the NAND circuits 101 and 102, i.e., deactivate one of the signals $\phi_5$ and $\phi_6$, thus activating the redundancy driving portions of all of the corresponding X decoder portions 1'-1 through 1'-16.

Figure 6:
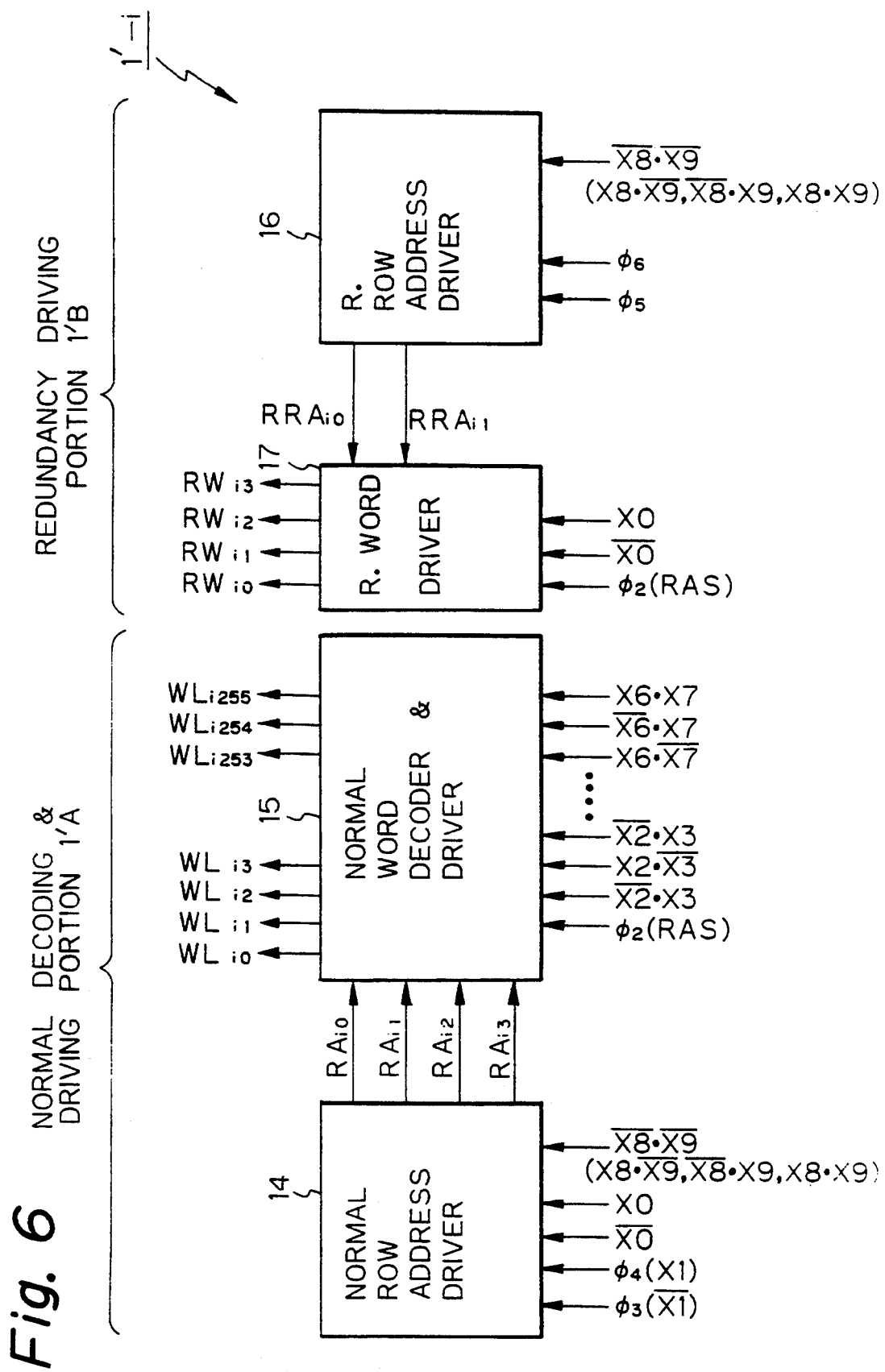
FIG. 6 is a detailed block circuit diagram of one decoder portion of FIG.2.

In FIG. 6, which is a detailed circuit diagram of the X decoder portion 1'-i of FIG. 2, the X decoder portion 1'-i includes a normal decoding and driving portion 1'A and a redundancy driving portion 1'B. That is, the X decoder portion 1'-i does not include a redundancy decoding function for a degenerate address due to the presence of the redundancy word decoders 5, 6, 7 and 8. The normal decoding and driving portion 1'A has a normal row address driver 14 which serves as a predecoder for decoding $\overline{X0}$, X0, $\overline{X1}(\phi_3)$ and X1($\phi_4$), and a normal word decoder and driver 15 which serves as a main decoder for decoding $\overline{X2}$, X2, $\overline{X3}$, X3, ..., $\overline{X7}$ and X7, to thereby select one word line from the 256 word lines $WL_{i0}$ through $WL_{i255}(2^8=256)$. Also, the redundancy driving portion 1'B has a redundancy row address driver 16 for decoding $\phi_5$ and $\phi_6$, and a redundancy word driver 17 for decoding $\overline{X0}$ and X0, to thereby select one redundancy word line from the four redundancy word lines $RW_{i0}$, $RW_{i1}$, $RW_{i2}$ and $RW_{i32}$. Since the normal row address driver 14 and the redundancy row address driver 16 are activated by one of the signals $\overline{X8}.\overline{X9}$, $X8.\overline{X9}$, $\overline{X8}.X9$ and $X8.X9$, all of the X decoder portion 1'-i is activated by one of the signals $\overline{X8}.\overline{X9}$, $X8.\overline{X9}$, $\overline{X8}.X9$ and $X8.X9$.

In FIG. 6, when an accessed address defined by the signals X2, X3, ..., and X7 and their inverted signals does not coincide with any of the addresses written in the fuse-type PROM's of FIGS. 3A through 3D, so that the signals $\phi_3$ and $\phi_4$ of the normal row address activating circuit 9 of FIG. 4 are logically the same as the signals $\overline{X1}$ and X1, respectively, the normal row address driver 14 makes one of its output signals $RA_{i0}$, $RA_{i1}$, $RA_{i2}$ and $RA_{i3}$ dependent on the signals $\overline{X0}$, X0, $\overline{X1}$ and X1, and therefore, the normal word decoder and driver 15 selects one word line from the 256 word lines. On the other hand, since the signals $\phi_5$ and $\phi_6$ of the redundancy row address activating circuit 10 of FIG. 5 are both high, the redundancy row address driver 16 is not activated, and therefore, the redundancy word driver 17 is not activated to deactivate all the redundancy word lines $RW_{i0}$, $RW_{i1}$, $RW_{i2}$ and $RW_{i3}$. Contrary to this, in FIG. 6, when an accessed address including the signals X8 and X9 coincides with one of the addresses written into the fuse-type PROM's of FIGS. 3A, 3B, 3C and 3D, the signals $\phi_3$ and $\phi_4$ of the normal row address activating circuit 9 of FIG. 4 are deactivated to disable the normal row address driver 14 and the norms1 word decoder and driver 15, thus deactivating all of the 256 word lines. On the other hand, since one of the signals $\phi_5$ and $\phi_6$ of the redundancy row address activating circuit 10 of FIG. 5 is high, the redundancy row address driver 16 makes one of its output signals $RRA_{i0}$ and $RRA_{i1}$ high, and therefore, the redundancy word driver 17 selects one redundancy word line from the four redundancy word lines $RW_{i0}$, $RW_{i1}$, $RW_{i2}$ and $RW_{i3}$.

Figure 7:
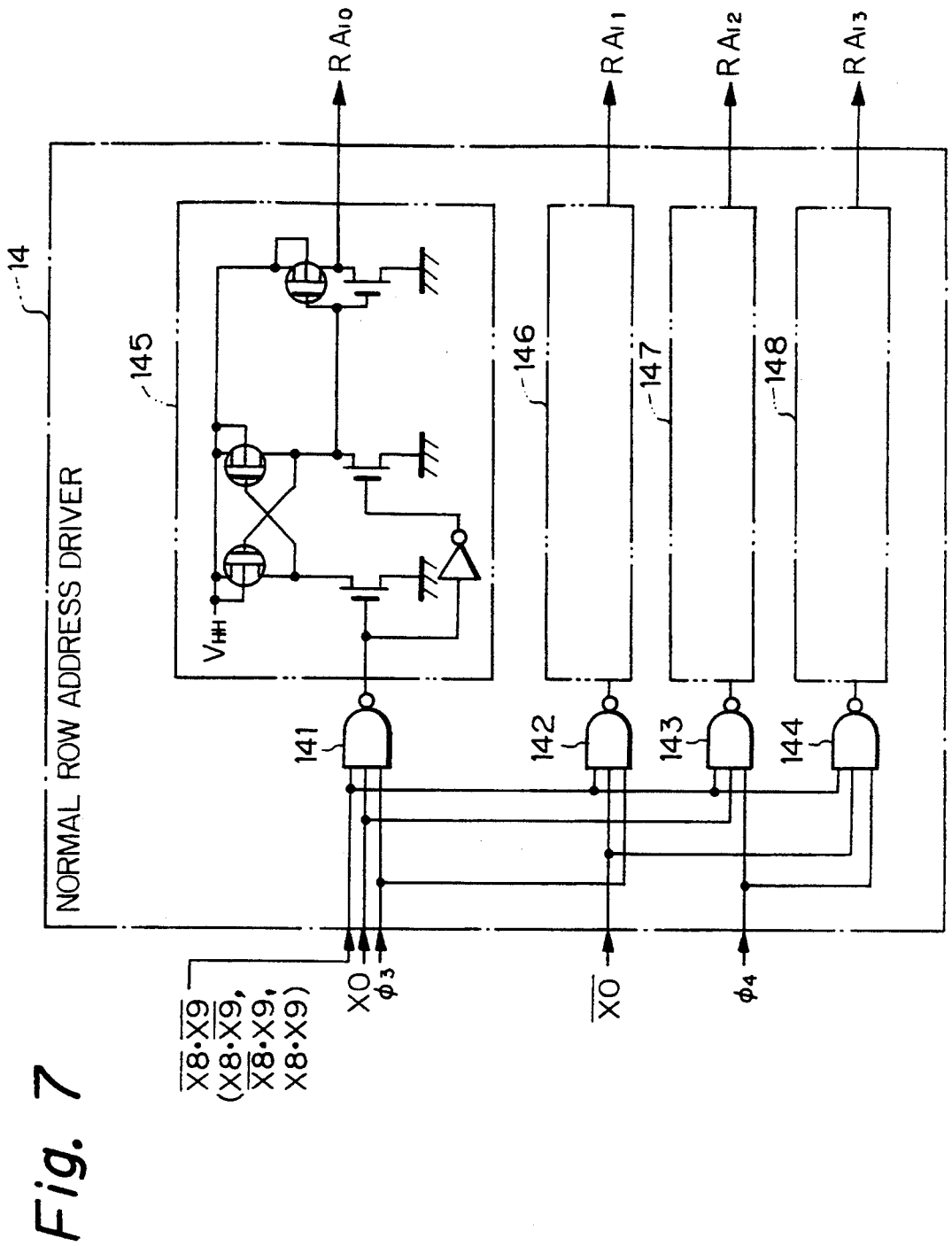
FIG. 7 is a detailed circuit diagram of the normal row address driver of FIG. 6.

In FIG. 7, which is a detailed circuit diagram of the normal row address driver 14 of FIG. 6, the normal row address driver 14 includes four NAND circuits 141, 142, 143 and 144 activated by one of the signals $\overline{X8}.\overline{X9}$, $X8.\overline{X9}$, $\overline{X8}.X9$ and $X8.X9$, and four drivers 145, 146, 147 and 148 powered by a voltage $V_{HH}$ which is obtained by boosting a power supply voltage $V_{DD}$ using the appropriate step-up circuit (not shown). When one of the signals $\phi_3$ and $\phi_4$ is high, one of the NAND circuits 141, 142, 143 and 144 makes its output low to activate one of the drivers 145, 146, 147 and 148. For example, if $X0=$"1"(high) and $\phi_3=$"1"(high) and $\phi_4=$"0"(low), then the output of the NAND circuit 141 is made low to activate the driver 145, thus making its output $RA_{i0}$ high. Contrary to this, when both of the signals $\phi_3$ and $\phi_4$ are low, none of the NAND circuits 141, 142, 143 and 144 are activated, and therefore, none of the drivers 145, 146, 147 and 148 are activated.

Figure 8:
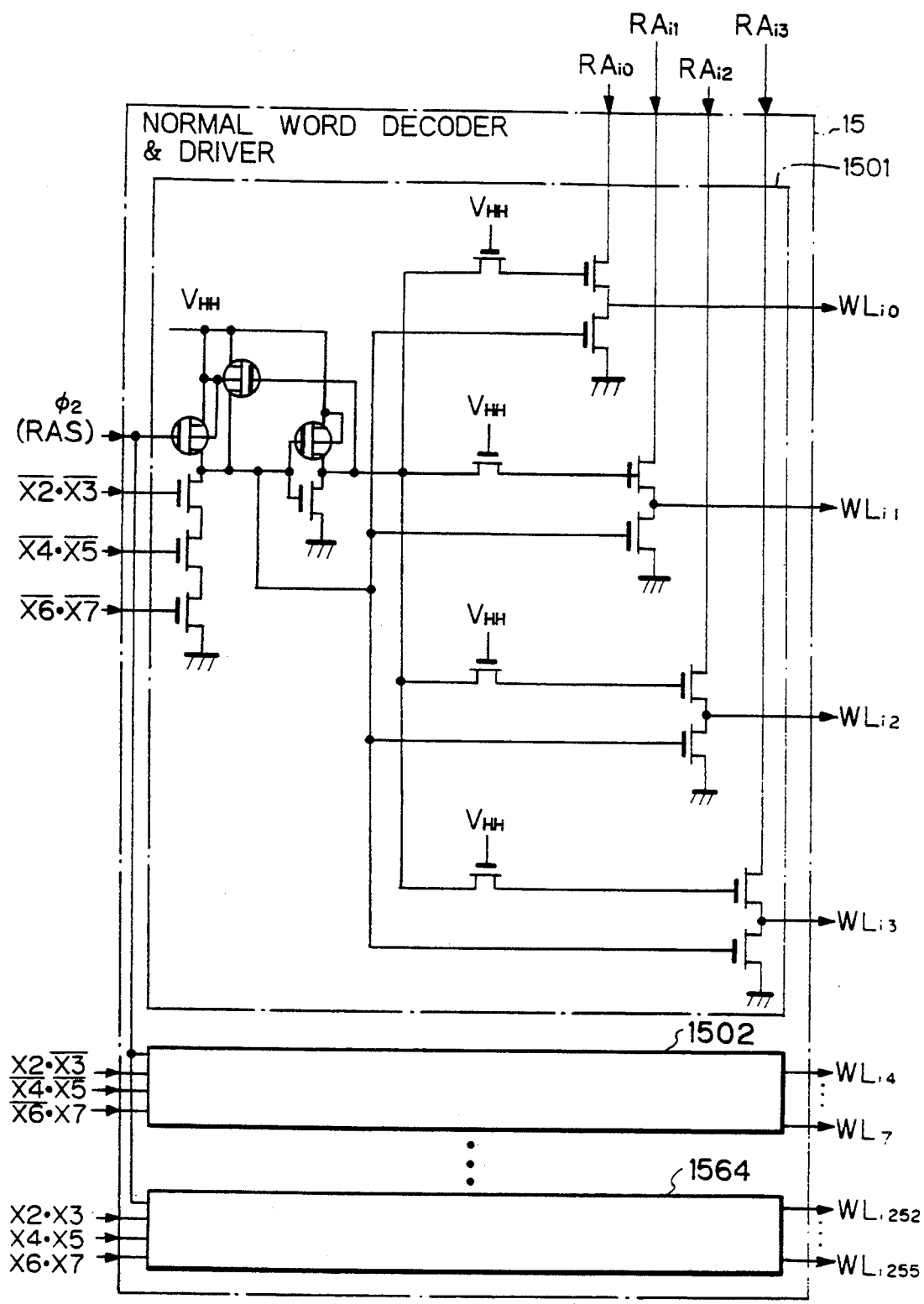
FIG. 8 is a detailed circuit diagram of the normal word decoder and driver of FIG. 6.

In FIG. 8, which is a detailed circuit diagram of the normal word decoder and driver 15 of FIG. 6, the normal word decoder and driver 15 includes 64 decoding and driving portions 1501 through 1564 activated by one of the signals $RA_{i0}$, $RA_{i1}$, $RA_{i2}$ and $RA_{i3}$ of the normal row address driver 14 of FIG. 7. Also, the decoding and driving portions 1501 through 1564 are activated by an AND logic of the three signals such as $\overline{X2}.\overline{X3}$, $\overline{X4}.\overline{X5}$ and $\overline{X6}.\overline{X7}$. For example, if $RA_{i0}=X2.\overline{X3}=\overline{X4}.\overline{X5}=\overline{X6}.\overline{X7}=$"1"(high), then the decoding and driving portion 1502 selects the word line $WL_{i4}$ from the word lines $WL_{i4}$, $WL_{i5}$, $WL_{i6}$ and $WL_{i7}$, i.e., the normal word decoder and driver 15 selects the word line $WL_{i4}$ from the 256 word lines $WL_{i0}$ through $WL_{i255}$.

Figure 9:
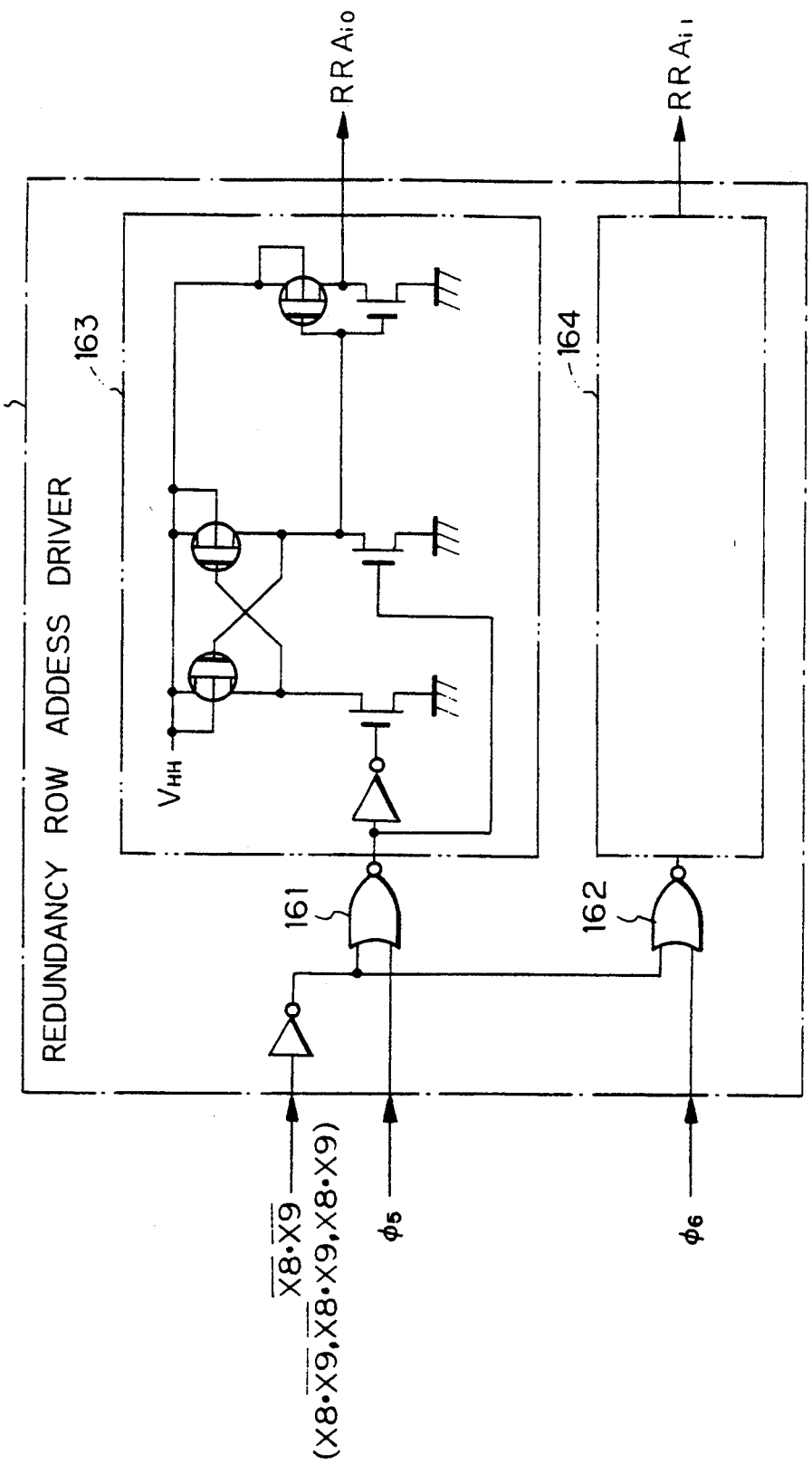
FIG. 9 is a detailed circuit diagram of the redundancy row address driver of FIG. 6.

In FIG. 9, which is a detailed circuit diagram of the redundancy row address driver 16 of FIG. 6, the redundancy row address driver 16 includes two NOR circuits 161 and 162 activated by one of the signals $\overline{X8}.\overline{X9}$, $X8.\overline{X9}$, $\overline{X8}.X9$ and $X8.X9$, and two drivers 163 and 164 powered by the voltage $V_{HH}$. When one of the signals $\phi_5$ and $\phi_6$ is low, one of the NOR circuits 161 and 162 makes its output low to activate one of the drivers 163 and 164. For example, if $\phi_5=$"0"(low) and $\phi_6=$"1"(high), then the output of the NOR circuit 161 is made low to activate the driver 163, thus making its output $RRA_{i0}$ high. Contrary to this, when both of the signals $\phi_5$ and $\phi_6$ are high, none of the NOR circuits 161 and 162 are activated, and therefore, none of the drivers 163 and 164 are activated.

Figure 10:
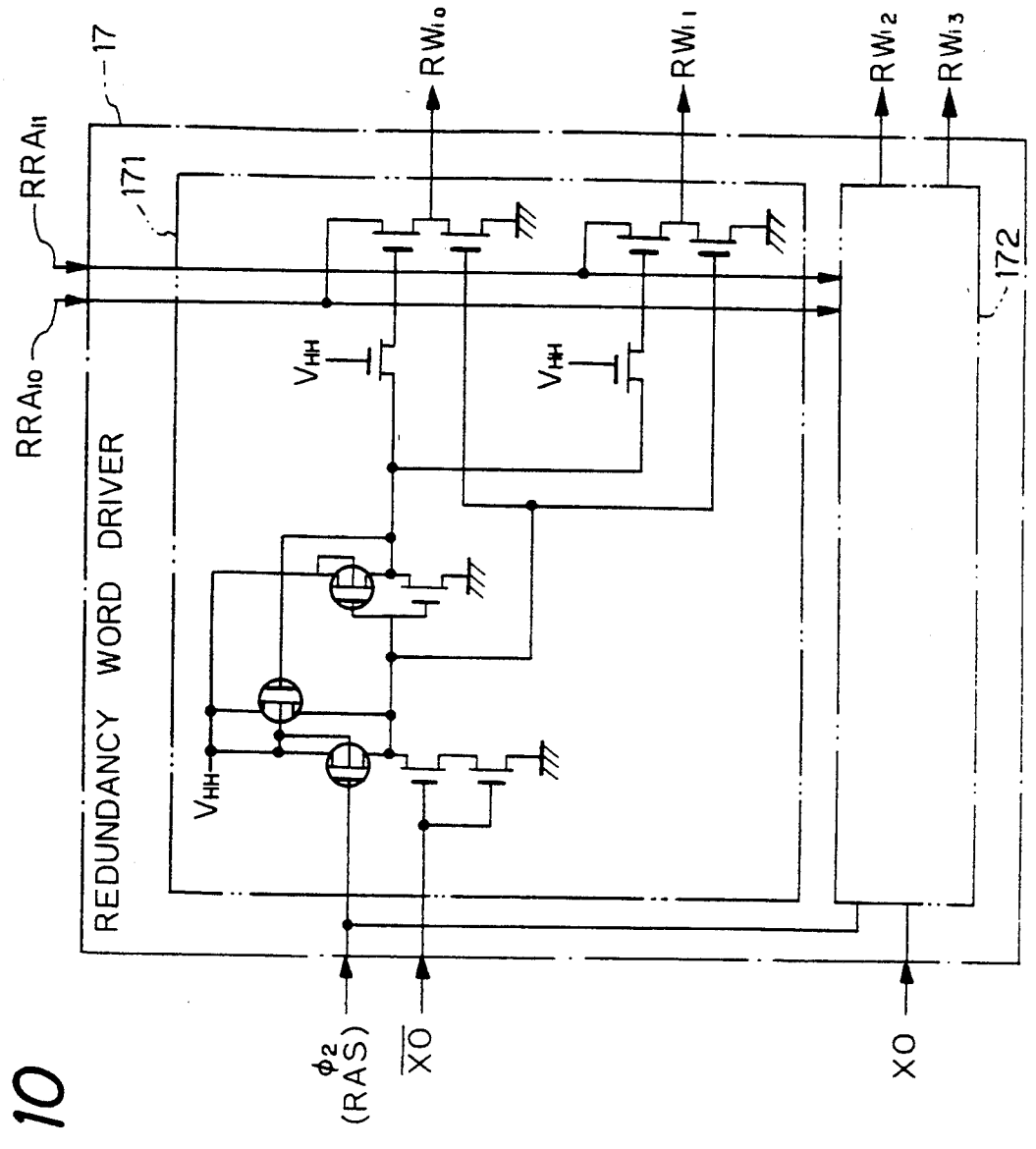
FIG. 10 is a detailed circuit diagram of the redundancy word driver of FIG. 6.

In FIG. 10, which is a detailed circuit diagram of the redundancy word driver 17, the redundancy word driver 17 includes two driving portions 171 and 172 activated by one of the signals $RRA_{i0}$ and $RRA_{i1}$ of the redundancy row address driver 16 of FIG. 9. Also, the driving portions 171 and 172 are activated by the two signals $\overline{X0}$ and X0. For example, if $RRA_{i0}=\overline{X0}=$"1"-(high), then the driving portion 171 selects the redundancy word line $RWL_{i0}$ from the redundancy word lines $RWL_{i0}$ and $RWL_{i1}$, i.e., the redundancy word driver 17 selects the redundancy word line $RWL_{i0}$ from the four redundancy word lines $RWL_{i0}$ through $RWL_{i3}$.

Figure 11:
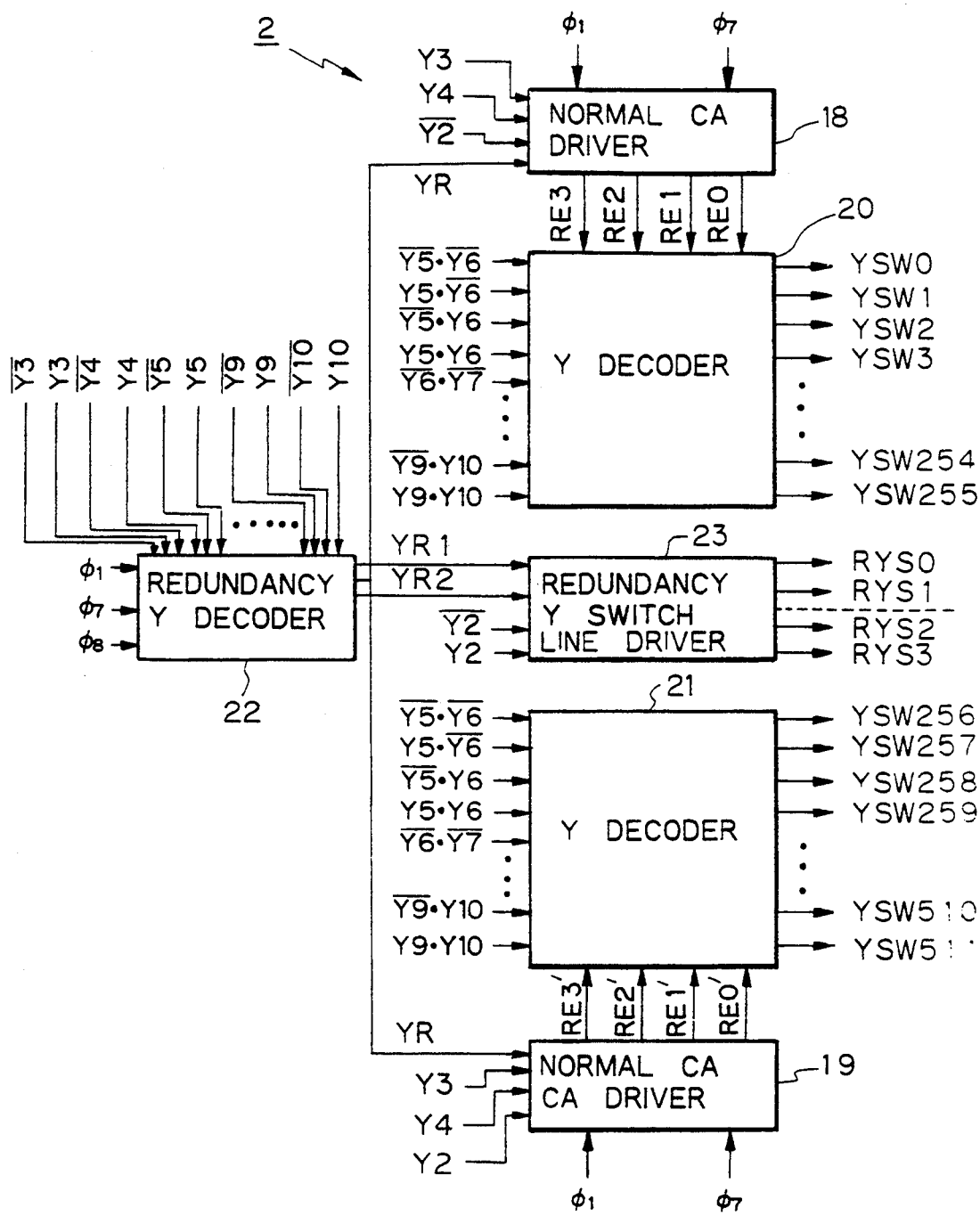
FIG. 11 is a detailed block circuit diagram of the Y decoder portion of FIG. 2.

In FIG. 11, which is a detailed circuit diagram of the Y decoder and driver 2 of FIG. 2, the Y decoder and driver 2 includes a normal decoding and driving portion and a redundancy decoding and driving portion. The normal decoding and driving portion has two normal column address drivers 18 and 19 which serve as a predecoder for decoding Y3 and Y4, and two Y decoders 20 and 21 which serve as a main decoder for decoding $\overline{Y5}$, Y5, $\overline{Y6}$, Y6, ..., $\overline{Y10}$ and Y10, thereby selecting one Y switch signal line from the 512 Y switch signal lines YSW0 through $YSW511(2^9=512)$. Also, the redundancy decoding and driving portion has a redundancy Y decoder 22 and a redundancy Y switch line driver 23, thereby selecting one redundancy Y switch line from the four redundancy Y switch lines RYS0, RYS1, RYS2 and RYS3. The redundancy Y decoder 22 has two fuse-type PROM's for storing two addresses indicating two defective Y switch signal lines defined by $\overline{Y3}$, Y3, $\overline{Y4}$, Y4, ..., $\overline{Y10}$ and Y10, as illustrated in FIG. 12.

Figure 12:
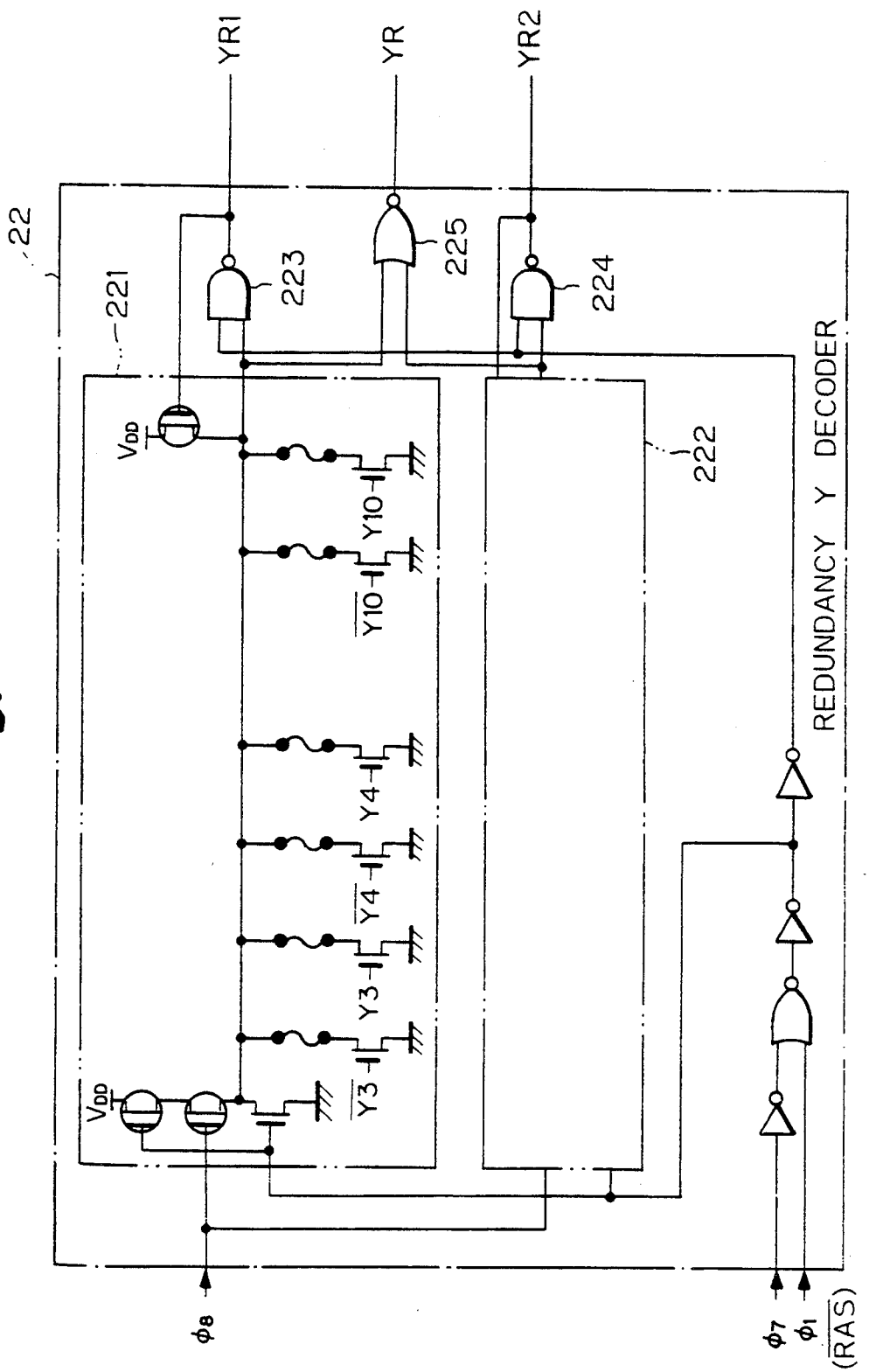
FIG. 12 is a detailed circuit diagram of the redundancy y decoder of FIG. 11.

In FIG. 12, when at least one of the 16 memory cells such as $C_{11}$, $C_{12}$, ..., $C_{44}$ is determined to be defective in a parallel test, an address defined by Y3 through Y10 written into a fuse-type PROM 221 or 222, i.e., the fuses thereof are trimmed by the laser. Outputs of the fuse-type PROM's 221 and 222 are connected to inputs of NAND circuits 223 and 224, respectively, which also receive a combination of the clock signals $\phi_1$ and $\phi_7$. That is, the fuse-type PROM's 221 and 222 are activated only when the clock signal $\phi_1(\overline{RAS})$ is low and the clock signal $\phi_7$ is high for indicating a sense operation being carried out. Further, the outputs of the fuse-type PROM's 221 and 222 are connected to inputs of a NOR circuit 225. Therefore, the fuse-type PROM's 221 and 222 are activated by the combination of the clock signals $\phi_1$ and $\phi_7$, and after the NAND circuits 223 and 224 are activated by the combination of the clock signals $\phi_1$ and $\phi_7$, the outputs of the fuse-type PROM's 221 and 222 are clamped by feeding back the outputs of the NAND circuits 223 and 224 thereto.

Again, in FIG. 11, when an accessed address defined by the signals Y3, Y4, . . . , and Y10 and their inverted signals does not coincide with any of the addresses written in the fuse-type PROM's of the redundancy Y decoder 22 of FIG. 12, so that the signal YR of the NOR circuit 225 of FIG. 12 is low, the normal column address drivers 18 and 19 and the Y decoders 20 and 21 entirely select one Y switch line from the 512 Y switch lines YSW0 through YSW511. On the other hand, since the signals YR1 and YR2 of the NAND circuits 223 and 224 of FIG. 12 are high, the redundancy column address driver 23 is not activated, and therefore, the redundancy Y switch line driver 23 is not activated to deactivate all the redundancy Y switch lines RYS0, RYS1, RYS2 and RYS3.

Contrary to this, in FIG. 11, when an accessed address defined by the signals Y3, Y4, . . . , and Y10 and their inverted signals coincides with one of the addresses written in the fuse-type PROM's of the redundancy Y decoder 22 of FIG. 12, so that the signal YR of the NOR circuit 225 of FIG. 12 is high, the normal column address drivers 18 and 19 and the Y decoders 20 and 21 are deactivated, thus deactivating all of the 512 Y switch lines YSW0 through YSW511. On the other hand, since one of the signal YR1 and YR2 of the NAND circuits 223 and 224 of FIG. 12 is low, the redundancy column address driver 23 is activated, and therefore, the redundancy Y switch line driver 23 is activated to activate one of the redundancy Y switch lines RYS0, RYS1, RYS2 and RYS3.

In FIGS. 11 and 12, note that reference $\phi_8$ designates an address transition detection(ATD) signal for the Y address. That is, when one bit of the Y address is changed, the signal $\phi_8$ is made low for a short time period by the Y address transition detection circuit(not shown).

Figure 13:
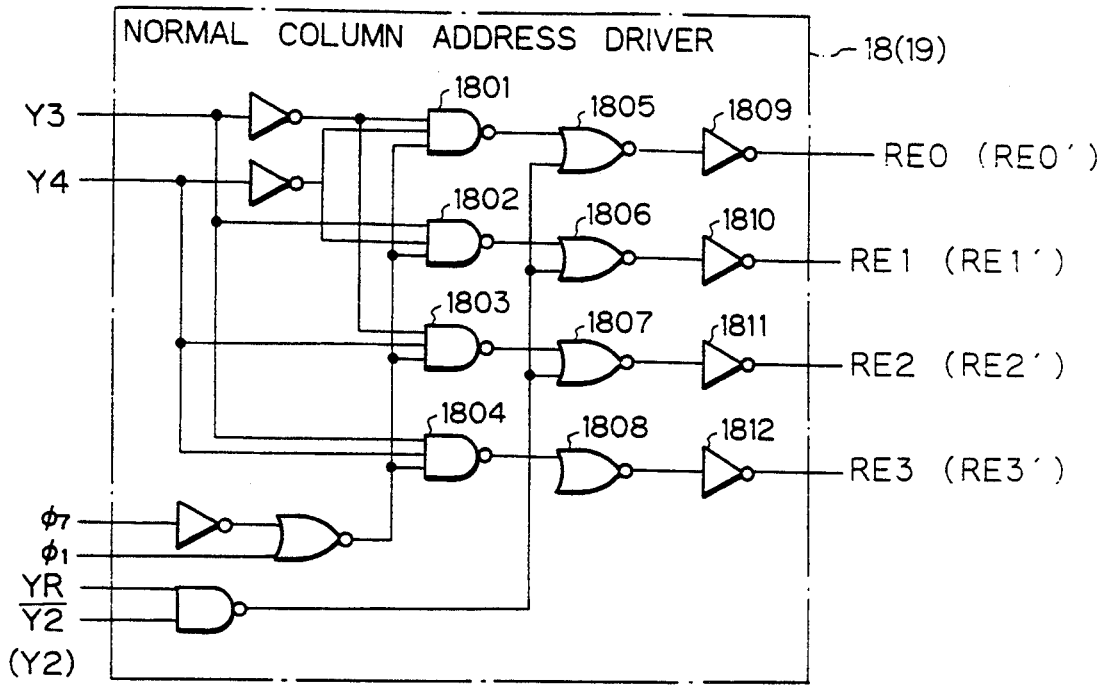
FIG. 13 is a detailed circuit diagram of the normal column address driver of FIG. 11.

In FIG. 13, which is a detailed circuit diagram of the normal column address driver 18(19) of FIG. 11, the normal column address driver 18(19) includes four NAND circuits 1801, 1802, 1803 and 1804 activated when the clock signal $\phi_1$ is low and the clock signal $\phi_7$ is high, and also includes four NOR circuits 1805, 1806, 1807 and 1808 activated when the signals $\overline{Y2}$(Y2) and YR are high. That is, in a state where all of the circuits 1801 through 1808 are activated, only one of the drivers 1809, 1810, 1811 and 1812 is activated. For example, if Y3=Y4="1"(high), the driver 1812 is activated by the NAND circuit 1804 and the NOR circuit 1808, to thereby make its output RE3(RE3') high.

Figure 14:
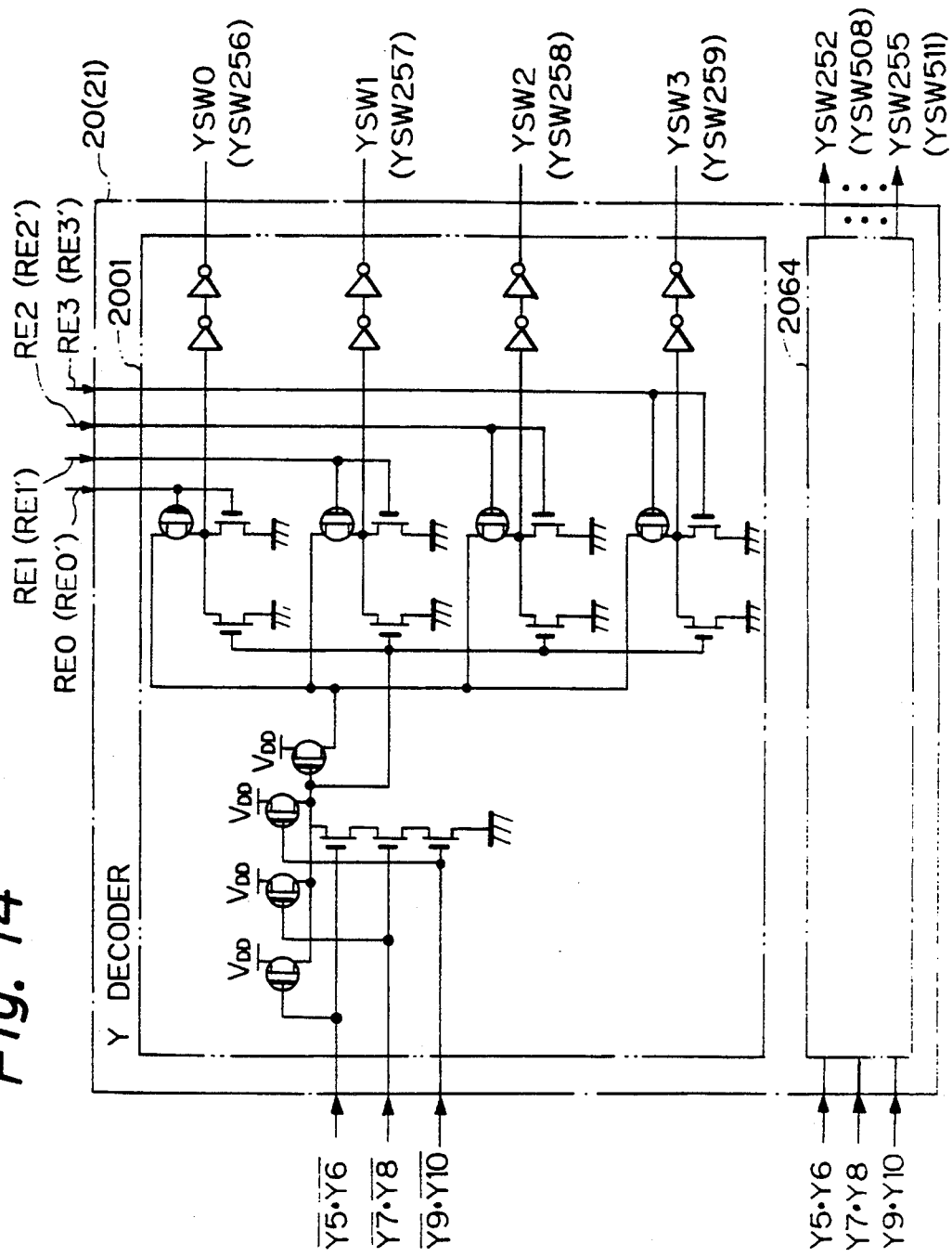
FIG. 14 is a detailed circuit diagram of the Y decoder of FIG. 11.

In FIG. 14 which is a detailed circuit diagram of the Y decoder 20(21) of FIG. 11, the y decoder 20(21) includes 64 decoding portions 2001 through 2064 activated by one of the signals RE0(RE0'), RE1(RE1'), RE2(RE2') and RE3(RE3') of the normal column address driver 18(19) of FIG. 13. Also, the decoding portions 2001 through 2064 are activated by an AND logic of the three signals such as $\overline{Y5.Y6}$, $\overline{Y7.Y8}$ and $\overline{Y9.Y10}$. For example, if RE3'=Y5.Y6=Y7.Y8=Y9.Y10="1"-(high), then the decoding portion 2064 selects the Y switch line YSW255 from the Y switch lines YSW252,
YSW253, YSW254 and YSW255, i.e., the Y decoders 20 and 21 select the Y switch line YSW255 from the 512 Y switch lines YSW0 through YSW511.

Figure 15:
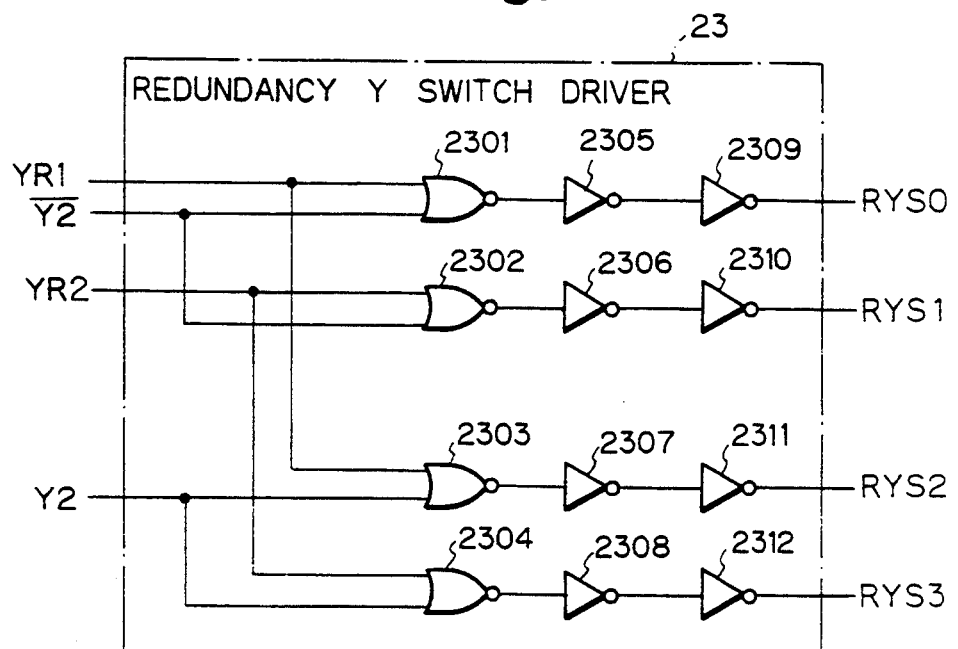
FIG. 15 is a detailed circuit diagram of the redundancy Y switch driver of FIG. 11.

In FIG. 15, which is a detailed circuit diagram of the redundancy Y switch driver 23 of FIG. 11, the redundancy Y switch driver 23 includes four NOR circuits 2301, 2302, 2303 and 2304 for receiving logic combinations of the signals YR1 and YR2 of the redundancy Y decoder 22 and the signals Y2 and Y2, four inverters 2305, 2306, 2307 and 2308 and four inverters(drivers) 2309, 2310, 2311 and 2312. That is, when an accessed address defined by $\overline{Y3}$, Y3, . . . , $\overline{Y10}$ and Y10 does not coincide with any of the addresses written into the fuse-type PROM's 221 and 222 of FIG. 12, so that the signals YR1 and YR2 are both high, none of the drivers 2309, 2310, 2311 and 2312 are activated, i.e., none of the redundancy Y switch lines RYS0, RYS1, RYS2 and RYS3 are selected. Contrary to this, when an accessed address defined by $\overline{Y3}$, Y3, . . . , $\overline{Y10}$ and Y10 coincides with one of the addresses written into the fuse-type PROM's 221 and 222 of FIG. 12, so that one of the signals YR1 and YR2 is low, one of the drivers 2309, 2310, 2311 and 2312 is activated, i.e., one of the redundancy Y switch lines RYS0, RYS1, RYS2 and RYS3 is selected depending upon the signals $\overline{Y2}$ and Y2. For example, if YR1=Y2="0"(low) and YR2=$\overline{Y2}$="1"-(high), the driver 2311 is activated to select the redundancy Y switch line RYS2.

Thus, in the first embodiment, since one redundancy word decoder is provided for a plurality of memory cell blocks in view of the degenerate addresses for a parallel test, the number of writing operations (laser trimming operations) can be reduced to reduce the test time of such a parallel test.

In the above-mentioned first embodiment, note that a redundancy configuration of the Y decoder and driver 2 is not indispensable. Also, in a parallel test, the signals $\overline{Y2}$ and Y2 are both made "1"(selected state) by the test control circuit(not shown), to simultaneously test 16 memory cells.

Figure 16:
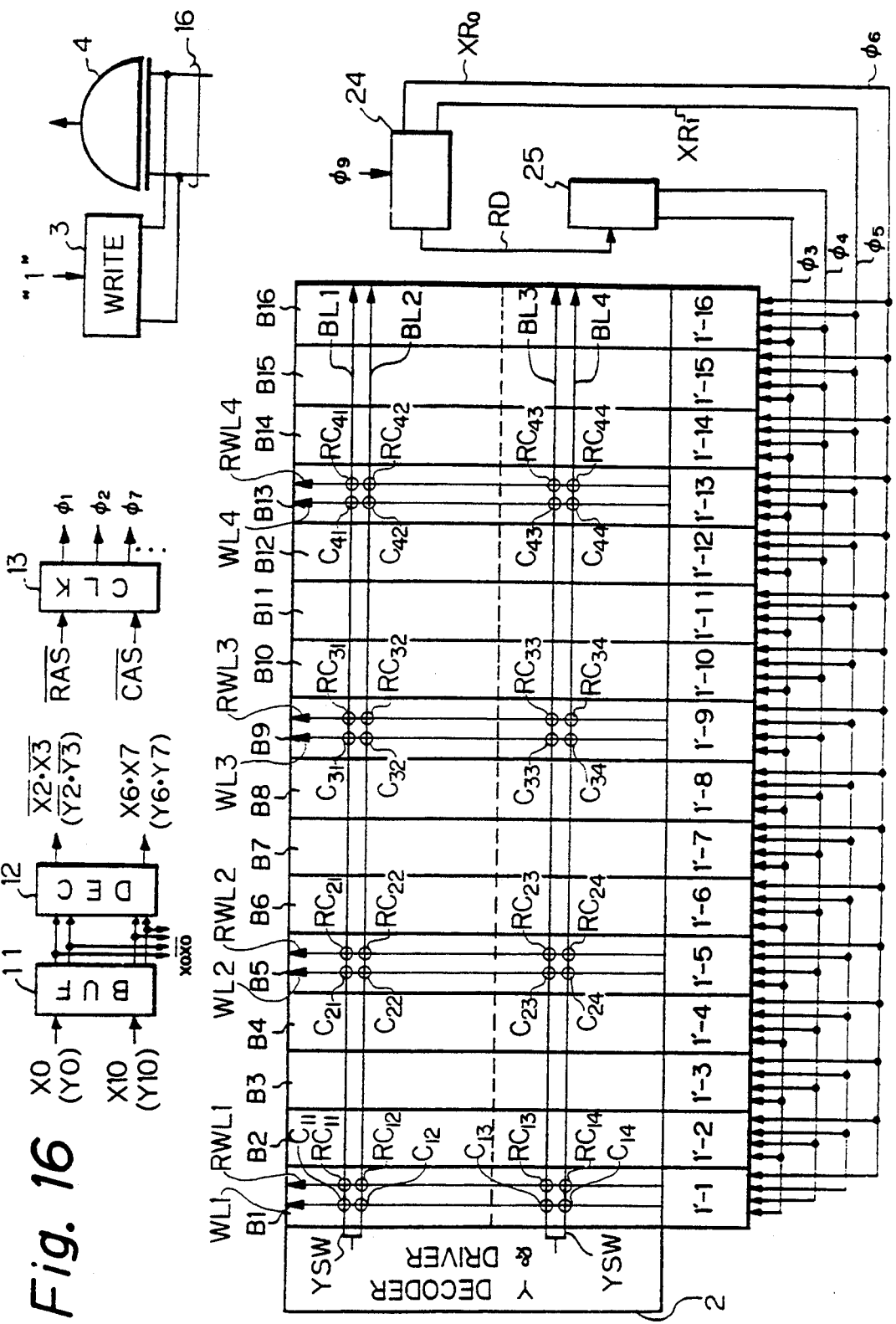
FIG. 16 is a block circuit diagram illustrating a second embodiment of the semiconductor memory device incorporating redundancy memory cells according to the present invention.

In FIG. 16, which illustrates a second embodiment of the present invention, a single redundancy word decoder 24 is provided instead of the redundancy word decoders 5, 6, 7 and 8 of the first embodiment. That is, the redundancy word decoder 24 is provided commonly for all the memory cell blocks B1 through B16. Therefore, none of the signals $\overline{X8.X9}$, $X8.\overline{X8}$, $\overline{X8}.X9$, and X8.X9 for identifying the groups of the memory cell blocks B1, B5, B9, B13; B2, B6, B10, B14; B3, B7, B11, B15; and B4, B8, B12, B16, are supplied to the redundancy word decoder 24, as illustrated in FIG. 17.

Figure 17:
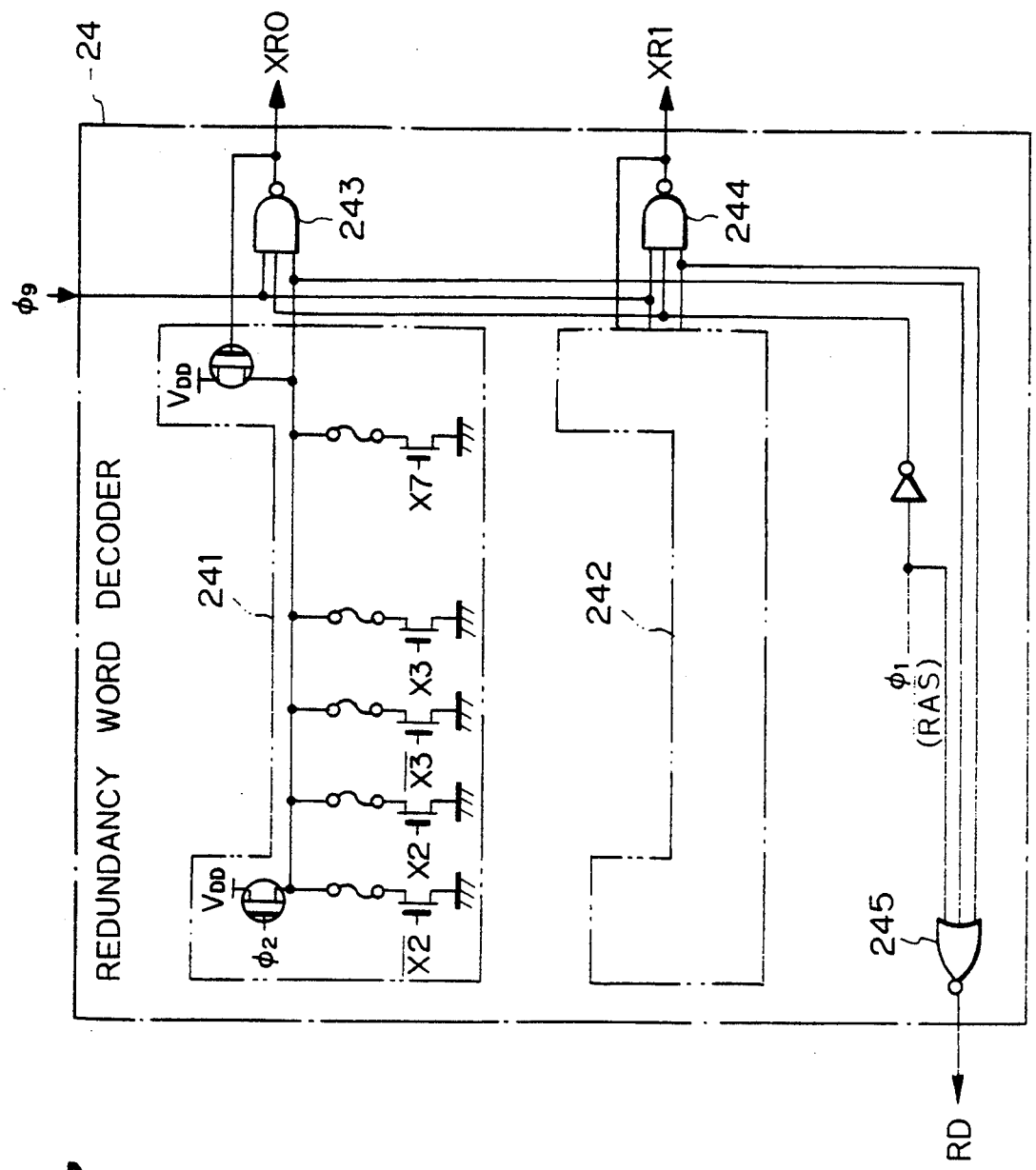
FIG. 17 is a detailed circuit diagram of the redundancy X decoder of FIG. 16.

Referring to FIG. 17, fuse-type PROM's 241 and 242 correspond to the fuse-type PROM's 51, 52, 61, 62, 71, 72, 81 and 82 of the redundancy word decoders 5, 6, 7 and 8 of FIGS. 3A, 3B, 3C and 3D, but do not receive the signals $\overline{X8.X9}$, $X8.\overline{X9}$, $\overline{X8}.X9$ and X8.X9. Also, reference $\phi_9$ designates a clock signal indicating an activation of the X address signal such as X0. For example, the clock signal $\phi_9$ can be obtained by the exclusive OR circuit (not shown) for receiving the signals $\overline{X0}$ and X0.

Figure 18:
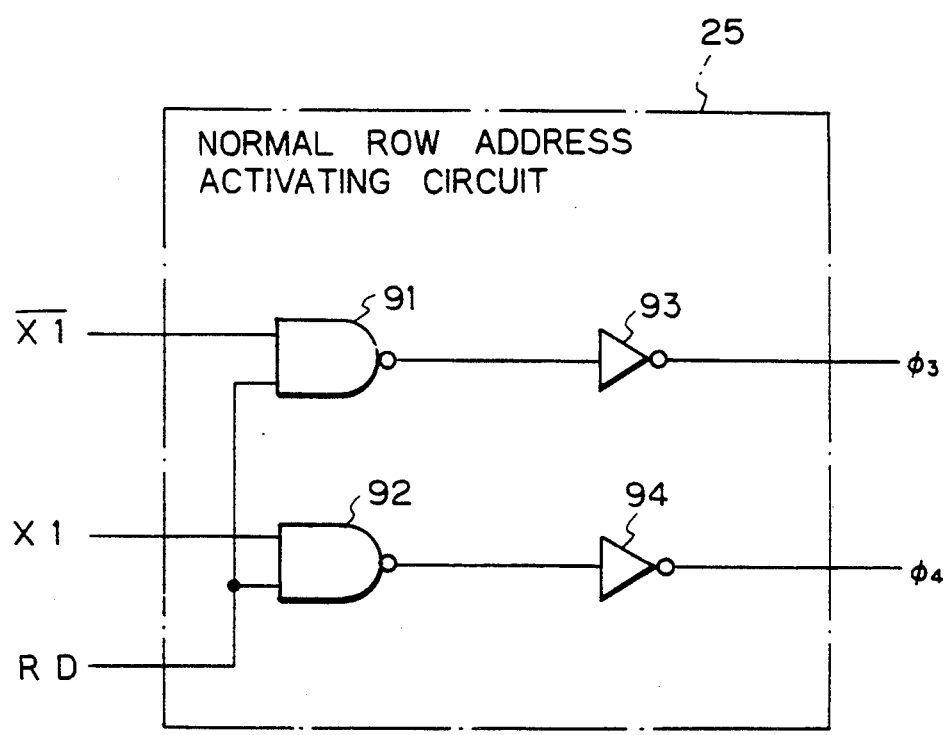
FIG. 18 is a detailed circuit diagram of the normal row address activating circuit of FIG. 16.

Also, in FIG. 18, since the signal RD of the redundancy word decoder 24 serves as the four signals $RD_0$, $RD_1$, $RD_2$ and $RD_3$ of the redundancy word decoders 5, 6, 7 and 8 of FIG. 2, a normal address activating circuit 25 can be obtained by simplifying the circuit of FIG. 4.

Further, in FIG. 16, since the signals $XR_0$ and $XR_1$ of the redundancy word decoder 24 serve as the four signals $XR_{00}$, $XR_{10}$, $XR_{20}$ and $XR_{30}$, and the four signals $XR_{01}$, $XR_{11}$, $XR_{21}$ and $XR_{31}$ of the redundancy word decoders 5, 6, 7 and 8 of FIG. 2, the signals $XR_0$ and $XR_1$ directly serve as the signal $\phi_5$ and $\phi_6$, respectively. Therefore, the redundancy row address activating circuit 10 of FIG. 2 is not provided.

In the above-mentioned second embodiment, since the number of fuse-type PROM's is reduced as compared with the first embodiment, the relief rate of defective memory cells is reduced as compared with the first embodiment. However, in the same way as in the first embodiment, the test time of a parallel test can be reduced by the second embodiment.

I claim:

1. A semiconductor memory device comprising:

a plurality of memory blocks each incorporating a plurality of memory cells and a plurality of redundancy memory cells;

said memory blocks being divided into a plurality of test groups;

said memory cells being located at intersections between a plurality of word lines and a plurality of bit lines;

said redundancy memory cells being located at intersections between a plurality of redundancy word lines and said bit lines;

normal decoder means for accessing one of said memory cells by a first address having a first address space;

said normal decoder means being separately provided for each of said memory blocks, comprising:

a plurality of series of normal word decoders incorporating drivers, each series provided for one of said memory blocks, for activating one of said word lines thereof;

a parallel test means for simultaneously testing a predetermined number of said memory cells by a degenerate address showing degeneracies of predetermined values of said first address;

redundancy decoder means for accessing said redundancy memory cells by a second address having a second address space;

said redundancy decoder means being commonly provided for each of said test groups, comprising:

a plurality of redundancy driving circuits each provided for one of said memory blocks, for activating one of said redundancy word lines thereof; and a single redundancy word decoder, provided commonly for all of said test groups, for activating said redundancy driving circuits thereof; and said degenerate address having a degenerate address space being written as said second address into only one location of said redundancy decoder means to replace at least one defective memory cell with its corresponding redundancy memory cell when at least one of said predetermined number of said memory cells tested by said degenerate address is determined to be defective.

2. A device as set forth in claim 1, wherein the second address space of said second address is the same as the degenerate address space of said degenerate address.

* * * * *

UNITED STATES PATENT AND TRADEMARK OFFICE
CERTIFICATE OF CORRECTION

PATENT NO.  : 5,394,369  
DATED       : February 28, 1995  
INVENTOR(S) : Akihiko KAGAMI Page 1 of 4

It is certified that error(s) appears in the above-identified patent and that said Letters Patent is hereby corrected as shown below:

Col. 2, lines 11 and 12, delete "underestood", insert --understood--.

Col. 2, line 42, delete "y" insert --Y--.

Col. 3, line 4, delete "RWL1, RWL2, RWL3, RWL4, insert --$RWL_1$, $RWL_2$, $RWL_3$, $RWL_4$--.

Col. 4, line 41 delete "$\overline{X2.X3}$, $X2.\overline{X3}$, $\overline{X2}.X3$," and insert --$\overline{\overline{X2}\cdot \overline{X3}}$, $X2\cdot \overline{\overline{X3}}$, $\overline{\overline{X2}\cdot X3}$,--

Col. 4, line 42 delete "X2.X3,..., $\overline{X6.X7}$, $X6.\overline{X7}$, $\overline{X6}.X7$, X6.X7" and insert --$X2\cdot X3$,..., $\overline{X6\cdot X7}$, $X6\cdot \overline{X7}$, $\overline{X6}\cdot X7$, $X6\cdot X7$--.

Col. 4, line 50, delete "$\overline{X8.X9}$" and insert --$\overline{X8}\cdot \overline{X9}$--

Col. 4, line 52, delete "$X8.\overline{X9}$" and insert --$X8\cdot \overline{X9}$--.

Col. 4, line 54, delete "$\overline{X8}.X9$" and insert --$\overline{X8}\cdot X9$--.

Col. 4, line 56, delete "X8.X9" and insert --$X8\cdot X9$--.

UNITED STATES PATENT AND TRADEMARK OFFICE
CERTIFICATE OF CORRECTION

PATENT NO. : 5,394,369
DATED : February 28, 1995
INVENTOR(S) : Akihiko KAGAMI

It is certified that error(s) appears in the above-identified patent and that said Letters Patent is hereby corrected as shown below:

Col. 5, line 28, delete "$\overline{RAS}$", insert --$\overline{RAS}$--.

Col. 5, line 43, delete "$\overline{X8}.\overline{X9}$" and insert --$\overline{X8}\cdot\overline{X9}$--.

Col. 5, line 50, delete "$\overline{RAS}$", insert --$\overline{RAS}$--.

Col. 5, line 50, delete "$\overline{X8}.\overline{X9}$" and insert --$\overline{X8}\cdot\overline{X9}$--.

Col. 5, line 59, delete "$X8.\overline{X9}$, $\overline{X8}.X9$ and $X8.X9$" and insert --$X8\cdot\overline{X9}$, $\overline{X8}\cdot X9$ and $X8\cdot X9$--.

Col. 7, line 9, delete "."

Col. 7, line 10, delete "$\overline{X8}.\overline{X9}$, $X8.\overline{X9}$, $\overline{X8}.X9$ and $X8.X9$" and insert --$\overline{X8}\cdot\overline{X9}$, $X8\cdot\overline{X9}$, $\overline{X8}\cdot X9$ and $X8\cdot X9$--.

Col. 7, line 12, delete "$\overline{X8}.\overline{X9}$, $X8.\overline{X9}$, $\overline{X8}.X9$, and $X8.X9$" and insert --$\overline{X8}\cdot\overline{X9}$, $X8\cdot\overline{X9}$, $\overline{X8}\cdot X9$ and $X8\cdot X9$--

Col. 7, line 35, delete "norms1", insert --normal--.

Col. 7, line 47, delete "$\overline{X8}.\overline{X9}$," and insert --$\overline{X8}\cdot\overline{X9}$,--.

Col. 7, line 48, delete "$X8.\overline{X9}$, $\overline{X8}.X9$ and $X8.X9$" and insert --$X8\cdot\overline{X9}$, $\overline{X8}\cdot X9$ and $X8\cdot X9$--.

UNITED STATES PATENT AND TRADEMARK OFFICE
CERTIFICATE OF CORRECTION

PATENT NO.   : 5,394,369
DATED        : February 28, 1995
INVENTOR(S)  : Akihiko KAGAMI It is certified that error(s) appears in the above-identified patent and that said Letters Patent is hereby corrected as shown below:

Col. 8, line 2, delete "$\overline{X2.X3}$, $\overline{X4.X5}$ and $\overline{X6.X7}$", and insert --$\overline{X2 \cdot X3}$, $\overline{X4 \cdot X5}$ and $\overline{X6 \cdot X7}$--.

Col. 8, line 3, delete "$RA_{i0} = \overline{X2.X3} = \overline{X4.X5} = \overline{X6.X7}$" and insert --$RA_{i0} = \overline{X2 \cdot X3} = \overline{X4 \cdot X5} = \overline{X6 \cdot X7}$--.

Col. 8, line 12, delete "$\overline{X8.X9}$," and insert --$\overline{X8 \cdot X9}$,--.

Col. 8, line 13, delete "$\overline{X8.X9}$, $\overline{X8}.X9$ and $X8.X9$" and insert --$\overline{X8 \cdot X9}$, $\overline{X8} \cdot X9$ and $X8 \cdot X9$--.

Col. 9, line 59, delete "y", insert --Y--.

Col. 9, line 65, delete "$\overline{Y5.Y6}$, $\overline{Y7.Y8}$ and $\overline{Y9.Y10}$." and insert --$\overline{Y5 \cdot Y6}$, $\overline{Y7 \cdot Y8}$ and $\overline{Y9 \cdot Y10}$.--.

Col. 9, line 66, delete "RE3' = Y5.Y6=Y7.Y8=Y9.Y10="1"-" and insert --RE3' =  Y5·Y6=Y7·Y8=Y9·Y10="1"- --.

Col. 10, line 9, delete first occurrence of "Y2" and insert --$\overline{Y2}$--.

Col. 10, line 48, delete "$\overline{X8.X9}$, $X8.\overline{x8}$, $\overline{X8}.X9$," and insert --$\overline{X8 \cdot X9}$, $X8 \cdot \overline{X9}$, $\overline{X8} \cdot X9$,--.

Col 10, line 49, delete "X8.X9" and insert --X8·X9--.

UNITED STATES PATENT AND TRADEMARK OFFICE
CERTIFICATE OF CORRECTION

PATENT NO.  : 5,394,369
DATED       : February 28, 1995
INVENTOR(S) : Akihiko KAGAMI It is certified that error(s) appears in the above-identified patent and that said Letters Patent is hereby corrected as shown below:

Col. 10, line 57, delete "$\overline{X8}.\overline{X9}, X8.\overline{X9}, \overline{X8}.X9$ and $X8.X9$" and insert --$\overline{X8}\cdot\overline{X9}, X8\cdot\overline{X9}, \overline{X8}\cdot X9$ and $X8\cdot X9$--.

Signed and Sealed this

Twenty-seventh Day of June, 1995

Attest:

BRUCE LEHMAN

Attesting Officer

Commissioner of Patents and Trademarks